US012293029B2

(12) United States Patent
Chan

(10) Patent No.: US 12,293,029 B2
(45) Date of Patent: May 6, 2025

(54) AMBIENT ELECTROMAGNETIC DISTORTION CORRECTION FOR ELECTROMAGNETIC TRACKING

(71) Applicant: Magic Leap, Inc., Plantation, FL (US)

(72) Inventor: Richmond B. Chan, Arlington Heights, IL (US)

(73) Assignee: Magic Leap, Inc., Plantation, FL (US)

( * ) Notice: Subject to any disclaimer, the term of this patent is extended or adjusted under 35 U.S.C. 154(b) by 0 days.

(21) Appl. No.: 17/505,497

(22) Filed: Oct. 19, 2021

(65) Prior Publication Data

US 2022/0035461 A1 Feb. 3, 2022

Related U.S. Application Data

(63) Continuation of application No. 16/654,879, filed on Oct. 16, 2019, now Pat. No. 11,157,090.

(60) Provisional application No. 62/823,956, filed on Mar. 26, 2019, provisional application No. 62/751,467, filed on Oct. 26, 2018.

(51) Int. Cl.
*G06F 3/01* (2006.01)
*G06F 3/0346* (2013.01)
*G06T 19/00* (2011.01)

(52) U.S. Cl.
CPC ............ *G06F 3/0346* (2013.01); *G06F 3/012* (2013.01); *G06T 19/006* (2013.01)

(58) Field of Classification Search
CPC ..... G06T 19/006; G06F 3/0346; G06F 3/012; G06F 3/014; G06F 3/013; G01R 33/02
See application file for complete search history.

(56) References Cited

U.S. PATENT DOCUMENTS

| | | | |
|---|---|---|---|
| 3,868,565 A | 2/1975 | Kuipers |
| 4,462,165 A | 7/1984 | Lewis |
| 4,945,305 A | 7/1990 | Blood |

(Continued)

FOREIGN PATENT DOCUMENTS

| | | |
|---|---|---|
| WO | WO 2017/189450 | 11/2017 |
| WO | WO 2020/086356 | 4/2020 |

OTHER PUBLICATIONS

International Search Report and Written Opinion for PCT Application No. PCT/US2019/56526 mailed Jan. 14, 2020.

(Continued)

*Primary Examiner* — Dennis P Joseph
(74) *Attorney, Agent, or Firm* — Seed IP Law Group LLP

(57) ABSTRACT

Head-mounted augmented reality (AR) devices can track pose of a wearer's head to provide a three-dimensional virtual representation of objects in the wearer's environment. An electromagnetic (EM) tracking system can track head or body pose. A handheld user input device can include an EM emitter that generates an EM field, and the head-mounted AR device can include an EM sensor that senses the EM field (e.g., for determining head pose). The generated EM field may be distorted due to nearby electrical conductors or ferromagnetic materials, which may lead to error in the determined pose. Systems and methods are disclosed that measure the degree of EM distortion, as well as correct for the EM distortion. The EM distortion correction may be performed in real time by the EM tracking system without the need for additional data from imaging cameras or other sensors.

20 Claims, 19 Drawing Sheets

(56) References Cited

U.S. PATENT DOCUMENTS

| | | |
|---|---|---|
| 6,172,499 B1 | 1/2001 | Ashe |
| 6,754,596 B2 | 6/2004 | Ashe |
| 6,850,221 B1 | 2/2005 | Tickle |
| 9,081,426 B2 | 7/2015 | Armstrong |
| 9,215,293 B2 | 12/2015 | Miller |
| 9,348,143 B2 | 5/2016 | Gao et al. |
| 9,417,452 B2 | 8/2016 | Schowengerdt et al. |
| 9,470,906 B2 | 10/2016 | Kaji et al. |
| 9,547,174 B2 | 1/2017 | Gao et al. |
| 9,576,397 B2 | 2/2017 | Johansson et al. |
| 9,671,566 B2 | 6/2017 | Abovitz et al. |
| 9,740,006 B2 | 8/2017 | Gao |
| 9,791,700 B2 | 10/2017 | Schowengerdt et al. |
| 9,851,563 B2 | 12/2017 | Gao et al. |
| 9,857,591 B2 | 1/2018 | Welch et al. |
| 9,874,749 B2 | 1/2018 | Bradski |
| 10,048,501 B2 | 8/2018 | Gao et al. |
| 10,261,162 B2 | 4/2019 | Bucknor et al. |
| 10,746,819 B2 * | 8/2020 | Chung .................. G06F 3/0346 |
| 2005/0246122 A1 | 11/2005 | Jones Jr. et al. |
| 2006/0028436 A1 | 2/2006 | Armstrong |
| 2006/0067573 A1 | 3/2006 | Parr et al. |
| 2007/0081123 A1 | 4/2007 | Lewis |
| 2008/0189661 A1 * | 8/2008 | Gundlach ............... G06F 3/017 |
| | | 382/103 |
| 2012/0127062 A1 | 5/2012 | Bar-Zeev et al. |
| 2012/0162549 A1 | 6/2012 | Gao et al. |
| 2013/0082922 A1 | 4/2013 | Miller |
| 2013/0117377 A1 | 5/2013 | Miller |
| 2013/0125027 A1 | 5/2013 | Abovitz |
| 2013/0208234 A1 | 8/2013 | Lewis |
| 2013/0242262 A1 | 9/2013 | Lewis |
| 2014/0071539 A1 | 3/2014 | Gao |
| 2014/0177023 A1 | 6/2014 | Gao et al. |
| 2014/0218468 A1 | 8/2014 | Gao et al. |
| 2014/0267420 A1 | 9/2014 | Schowengerdt |
| 2014/0306866 A1 | 10/2014 | Miller et al. |
| 2015/0016777 A1 | 1/2015 | Abovitz et al. |
| 2015/0103306 A1 | 4/2015 | Kaji et al. |
| 2015/0178939 A1 | 6/2015 | Bradski et al. |
| 2015/0205126 A1 | 7/2015 | Schowengerdt |
| 2015/0222883 A1 | 8/2015 | Welch |
| 2015/0222884 A1 | 8/2015 | Cheng |
| 2015/0268415 A1 | 9/2015 | Schowengerdt et al. |
| 2015/0302652 A1 | 10/2015 | Miller et al. |
| 2015/0309263 A2 | 10/2015 | Abovitz et al. |
| 2015/0326570 A1 | 11/2015 | Publicover et al. |
| 2015/0346490 A1 | 12/2015 | TeKolste et al. |
| 2015/0346495 A1 | 12/2015 | Welch et al. |
| 2016/0011419 A1 | 1/2016 | Gao |
| 2016/0026253 A1 | 1/2016 | Bradski et al. |
| 2016/0259404 A1 | 9/2016 | Woods |
| 2017/0186177 A1 | 6/2017 | Nagori et al. |
| 2019/0242952 A1 | 8/2019 | Schneider et al. |
| 2020/0133405 A1 | 4/2020 | Chan |

OTHER PUBLICATIONS

International Preliminary Report on Patentability for PCT Application No. PCT/US2019/56526 mailed May 6, 2021.

ARToolKit: https://web.archive.org/web/20051013062315/http://www.hitl.washington.edu:80/artoolkit/documentation/hardware.htm, archived Oct. 13, 2005.

Azuma, "A Survey of Augmented Reality," Teleoperators and Virtual Environments 6, 4 (Aug. 1997), pp. 355-385. https://web.archive.org/web/20010604100006/http://www.cs.unc.edu/~azuma/ARpresence.pdf.

Azuma, "Predictive Tracking for Augmented Realty," TR95-007, Department of Computer Science, UNC-Chapel Hill, NC, Feb. 1995.

Bimber, et al., "Spatial Augmented Reality—Merging Real and Virtual Worlds," 2005 https://web.media.mit.edu/~raskar/book/BimberRaskarAugmentedRealityBook.pdf.

Gallo, K., "An Error Analysis of 3-D Electromagnetic Trackers," A dissertation presented by Katherine Gallo to the Faculty of the Graduate College of the University of Vermont, May 2012.

Jacob, "Eye Tracking in Advanced Interface Design," Human-Computer Interaction Lab Naval Research Laboratory, Washington, D.C. / paper/ in Virtual Environments and Advanced Interface Design, ed. by W. Barfield and T.A. Furness, pp. 258-288, Oxford University Press, New York (1995).

Kalmus, H., "A New Guiding and Tracking System," Armed Services Technical Information Agency, Arlington Hall Station, Arlington 12, Virginia, unclassified, Sep. 20, 1961.

Raab, F., et al. "Magnetic Position and Orientation Tracking System," IEEE Transactions on Aerospace and Electronic Systems, vol. AES-15, No. 5, Sep. 1979.

Tanriverdi and Jacob, "Interacting With Eye Movements in Virtual Environments," Department of Electrical Engineering and Computer Science, Tufts University, Medford, MA—paper/Proc. ACM CHI 2000 Human Factors in Computing Systems Conference, pp. 265-272, Addison-Wesley/ACM Press (2000).

Extended European Search Report, dated Jul. 13, 2022, for European Application No. 19875559.7-1224, 9 pages.

* cited by examiner

AMBIENT ELECTROMAGNETIC DISTORTION CORRECTION FOR ELECTROMAGNETIC TRACKING

CROSS-REFERENCE TO RELATED APPLICATIONS

This application is a continuation application of U.S. patent application Ser. No. 16/654,879, filed Oct. 16, 2019, titled AMBIENT ELECTROMAGNETIC DISTORTION CORRECTION FOR ELECTROMAGNETIC TRACKING, which claims the benefit of priority to U.S. Patent Application No. 62/751,467, filed Oct. 26, 2018, and to U.S. Patent Application No. 62/823,956, filed Mar. 26, 2019; both of which are titled AMBIENT ELECTROMAGNETIC DISTORTION CORRECTION FOR ELECTROMAGNETIC TRACKING, and both of which are hereby incorporated by reference herein in their entireties.

BACKGROUND

Field

The present disclosure relates generally to systems and methods to determine position or orientation of an object using electromagnetic tracking and more particularly to correcting for ambient distortion of the electromagnetic field in the vicinity of electromagnetic emitters or sensors.

Modern computing and display technologies have facilitated the development of systems for so called "virtual reality" or "augmented reality" experiences, wherein digitally reproduced images or portions thereof are presented to a user in a manner wherein they seem to be, or may be perceived as, real. A virtual reality, or "VR", scenario typically involves presentation of digital or virtual image information without transparency to other actual real-world visual input; an augmented reality, or "AR", scenario typically involves presentation of digital or virtual image information as an augmentation to visualization of the actual world around the user.

SUMMARY

Head-mounted augmented reality (AR) devices can track the pose of the wearer's head (or other body part) to be able to provide a three-dimensional virtual representation of objects in the wearer's environment. Embodiments of an electromagnetic (EM) tracking system can be used to track head pose or body gestures. For example, a handheld user input device can include an EM emitter and the head-mounted AR device can include an EM sensor. In some implementations, the EM emitter generates an EM field that can be sensed by the EM sensor. EM information from the sensor can be analyzed to determine location and/or orientation of the sensor and thereby the wearer's head pose. The pose can be a six degree-of-freedom (6DOF) pose including three spatial coordinates and three angular coordinates.

The EM field generated by the EM emitter can be distorted due to the presence of nearby electrical conductors or ferromagnetic materials. These EM field distortions may lead to error in the determined pose. Systems and methods are disclosed that correct for the EM distortion. The EM distortion correction may be performed in real time by the EM tracking system without the need, in some implementations, for additional data from imaging cameras or other sensors (e.g., to determine ground truth estimates for EM sensor and EM emitter relative pose or distance). In some systems and methods, a novel EM distortion correction scheme based on singular value decomposition of an EM field matrix can be applied to estimate whether EM distortion exists and to correct for the distortion. Further, some systems and methods advantageously utilize a rapid and computationally efficient analytic technique for determining 6DOF pose from the EM field matrix without the need for iterative numerical methods, which can be computationally inefficient and error-prone in some situations.

The ambient electromagnetic field distortion correction techniques are not limited to AR or VR applications and in other implementations can be applied to EM tracking of any object. For example, the EM field distortion correction techniques can be applied to tracking medical devices and instruments in an operating room.

Details of one or more implementations of the subject matter described in this specification are set forth in the accompanying drawings and the description below. Other features, aspects, and advantages will become apparent from the description, the drawings, and the claims. Neither this summary nor the following detailed description purports to define or limit the scope of the inventive subject matter.

DETAILED DESCRIPTION

Overview of AR, VR and Localization Systems

Figure 1:
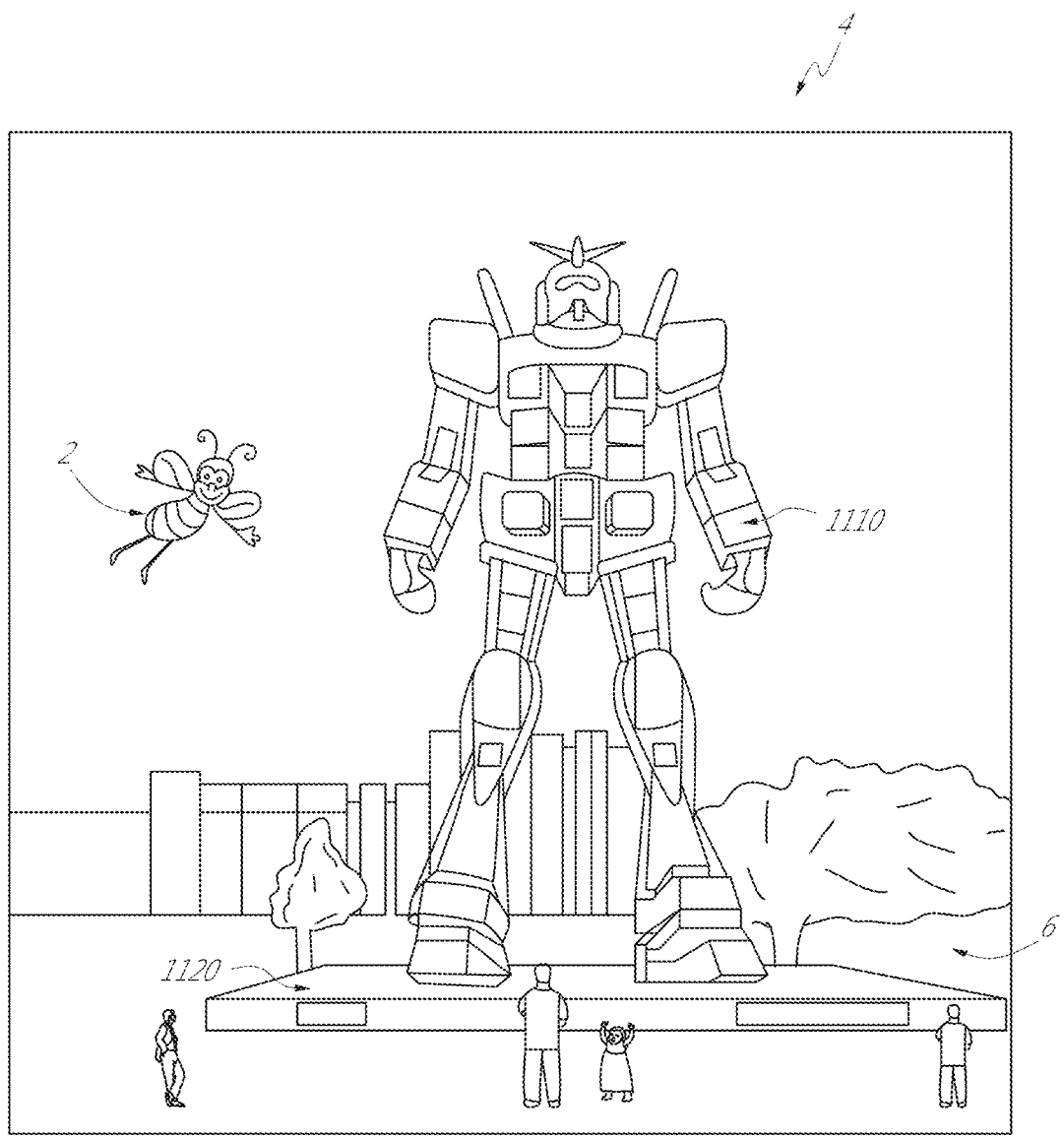
FIG. 1 depicts an illustration of an augmented reality scenario with certain virtual reality objects, and certain physical objects viewed by a person.

In FIG. 1 an augmented reality scene (4) is depicted wherein a user of an AR technology sees a real-world park-like setting (6) featuring people, trees, buildings in the background, and a concrete platform (1120). In addition to these items, the user of the AR technology also perceives that he "sees" a robot statue (1110) standing upon the real-world platform (1120), and a cartoon-like avatar character (2) flying by which seems to be a personification of a bumble bee, even though these elements (2, 1110) do not exist in the real world. As it turns out, the human visual perception system is very complex, and producing a VR or AR technology that facilitates a comfortable, natural-feeling, rich presentation of virtual image elements amongst other virtual or real-world imagery elements is challenging.

For instance, head-worn AR displays (or helmet-mounted displays, or smart glasses) typically are at least loosely coupled to a user's head, and thus move when the user's head moves. If the user's head motions are detected by the display system, the data being displayed can be updated to take the change in head pose into account.

As an example, if a user wearing a head-worn display views a virtual representation of a three-dimensional (3D) object on the display and walks around the area where the 3D object appears, that 3D object can be re-rendered for each viewpoint, giving the user the perception that he or she is walking around an object that occupies real space. If the head-worn display is used to present multiple objects within a virtual space (for instance, a rich virtual world), measurements of head pose (e.g., the location and orientation of the user's head) can be used to re-render the scene to match the user's dynamically changing head location and orientation and provide an increased sense of immersion in the virtual space.

In AR systems, detection or calculation of head pose can facilitate the display system to render virtual objects such that they appear to occupy a space in the real world in a manner that makes sense to the user. In addition, detection of the position and/or orientation of a real object, such as handheld device (which also may be referred to as a "totem"), haptic device, or other real physical object, in relation to the user's head or AR system may also facilitate the display system in presenting display information to the user to enable the user to interact with certain aspects of the AR system efficiently. As the user's head moves around in the real world, the virtual objects may be re-rendered as a function of head pose, such that the virtual objects appear to remain stable relative to the real world. At least for AR applications, placement of virtual objects in spatial relation to physical objects (e.g., presented to appear spatially proximate a physical object in two- or three-dimensions) may be a non-trivial problem. For example, head movement may significantly complicate placement of virtual objects in a view of an ambient environment. Such is true whether the view is captured as an image of the ambient environment and then projected or displayed to the end user, or whether the end user perceives the view of the ambient environment directly. For instance, head movement will likely cause a field of view of the end user to change, which will likely require an update to where various virtual objects are displayed in the field of the view of the end user. Additionally, head movements may occur within a large variety of ranges and speeds. Head movement speed may vary not only between different head movements, but within or across the range of a single head movement. For instance, head movement speed may initially increase (e.g., linearly or not) from a starting point, and may decrease as an ending point is reached, obtaining a maximum speed somewhere between the starting and ending points of the head movement. Rapid head movements may even exceed the ability of the particular display or projection technology to render images that appear uniform and/or as smooth motion to the end user.

Head tracking accuracy and latency (e.g., the elapsed time between when the user moves his or her head and the time when the image gets updated and displayed to the user) have been challenges for VR and AR systems. Especially for display systems that fill a substantial portion of the user's visual field with virtual elements, it is advantageous if the accuracy of head-tracking is high and that the overall system latency is very low from the first detection of head motion to the updating of the light that is delivered by the display to the user's visual system. If the latency is high, the system can create a mismatch between the user's vestibular and visual sensory systems, and generate a user perception scenario that can lead to motion sickness or simulator sickness. If the system latency is high, the apparent location of virtual objects will appear unstable during rapid head motions.

In addition to head-worn display systems, other display systems can benefit from accurate and low latency head pose detection. These include head-tracked display systems in which the display is not worn on the user's body, but is, e.g., mounted on a wall or other surface. The head-tracked display acts like a window onto a scene, and as a user moves his head relative to the "window" the scene is re-rendered to match the user's changing viewpoint. Other systems include a head-worn projection system, in which a head-worn display projects light onto the real world.

Additionally, in order to provide a realistic augmented reality experience, AR systems may be designed to be interactive with the user. For example, multiple users may play a ball game with a virtual ball and/or other virtual objects. One user may "catch" the virtual ball, and throw the ball back to another user. In some embodiments, a first user may be provided with a totem (e.g., a real bat communicatively coupled to the AR system) to hit the virtual ball. In some embodiments, a virtual user interface may be presented to the AR user to allow the user to select one of many options. The user may use totems, haptic devices, wearable components, or simply touch the virtual screen to interact with the system.

Detecting head pose and orientation of the user, and detecting a physical location of real objects in space enable the AR system to display virtual content in an effective and enjoyable manner. However, although these capabilities are key to an AR system, but are difficult to achieve. In other words, the AR system can recognize a physical location of a real object (e.g., user's head, totem, haptic device, wearable component, user's hand, etc.) and correlate the physical coordinates of the real object to virtual coordinates corresponding to one or more virtual objects being displayed to the user. This generally requires highly accurate sensors and sensor recognition systems that track a position and orientation of one or more objects at rapid rates. Current approaches do not perform localization at satisfactory speed or precision standards.

Thus, there is a need for a better localization system in the context of AR and VR devices.

Example AR and VR Systems and Components

Referring to FIGS. 2A-2D, some general componentry options are illustrated. In the portions of the detailed description which follow the discussion of FIGS. 2A-2D, various systems, subsystems, and components are presented for addressing the objectives of providing a high-quality, comfortably-perceived display system for human VR and/or AR.

Figure 2A:
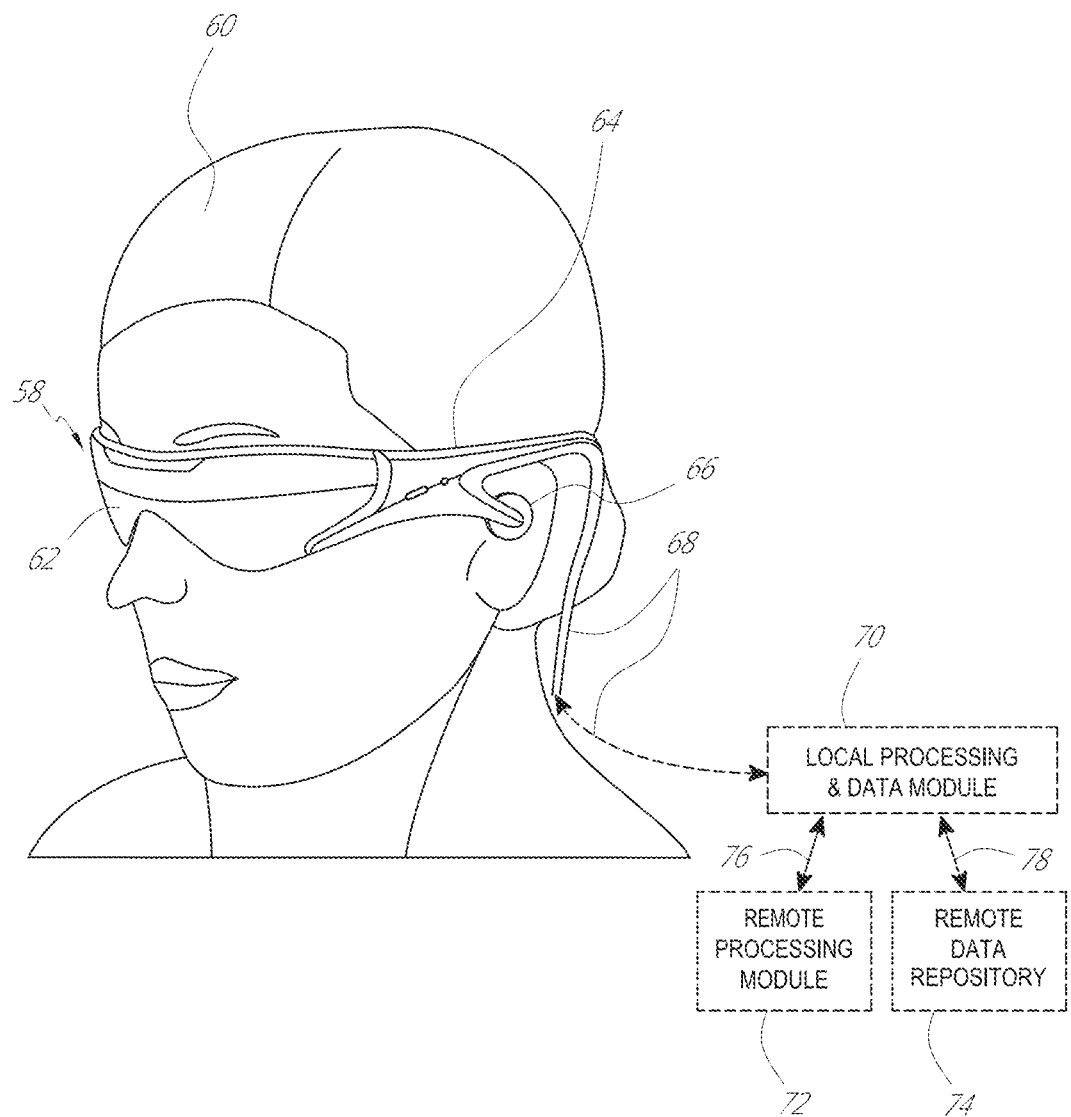
FIGS. 2A-2D schematically illustrate examples of a wearable system.
Figure 2B:
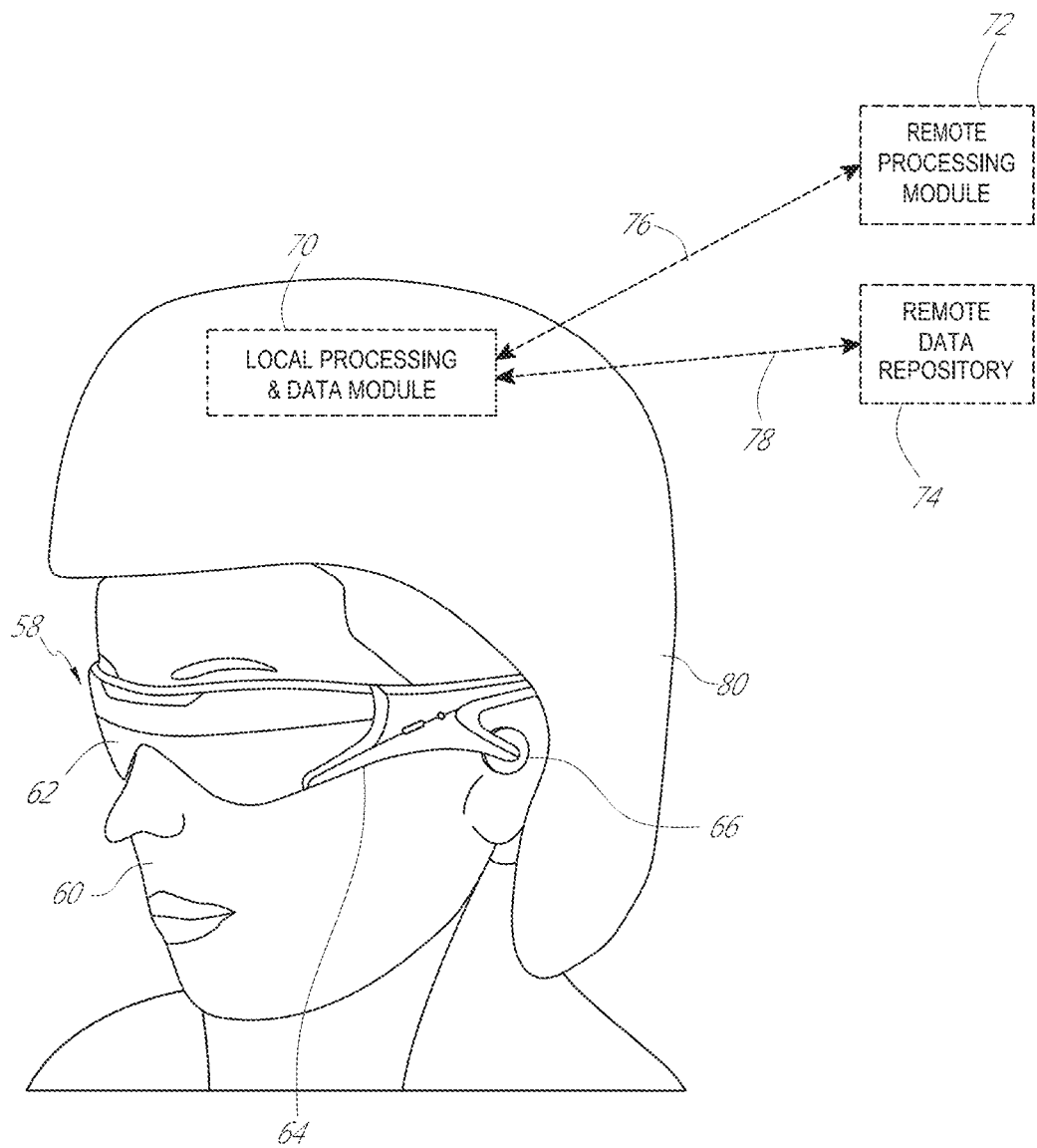
Figure 2C:
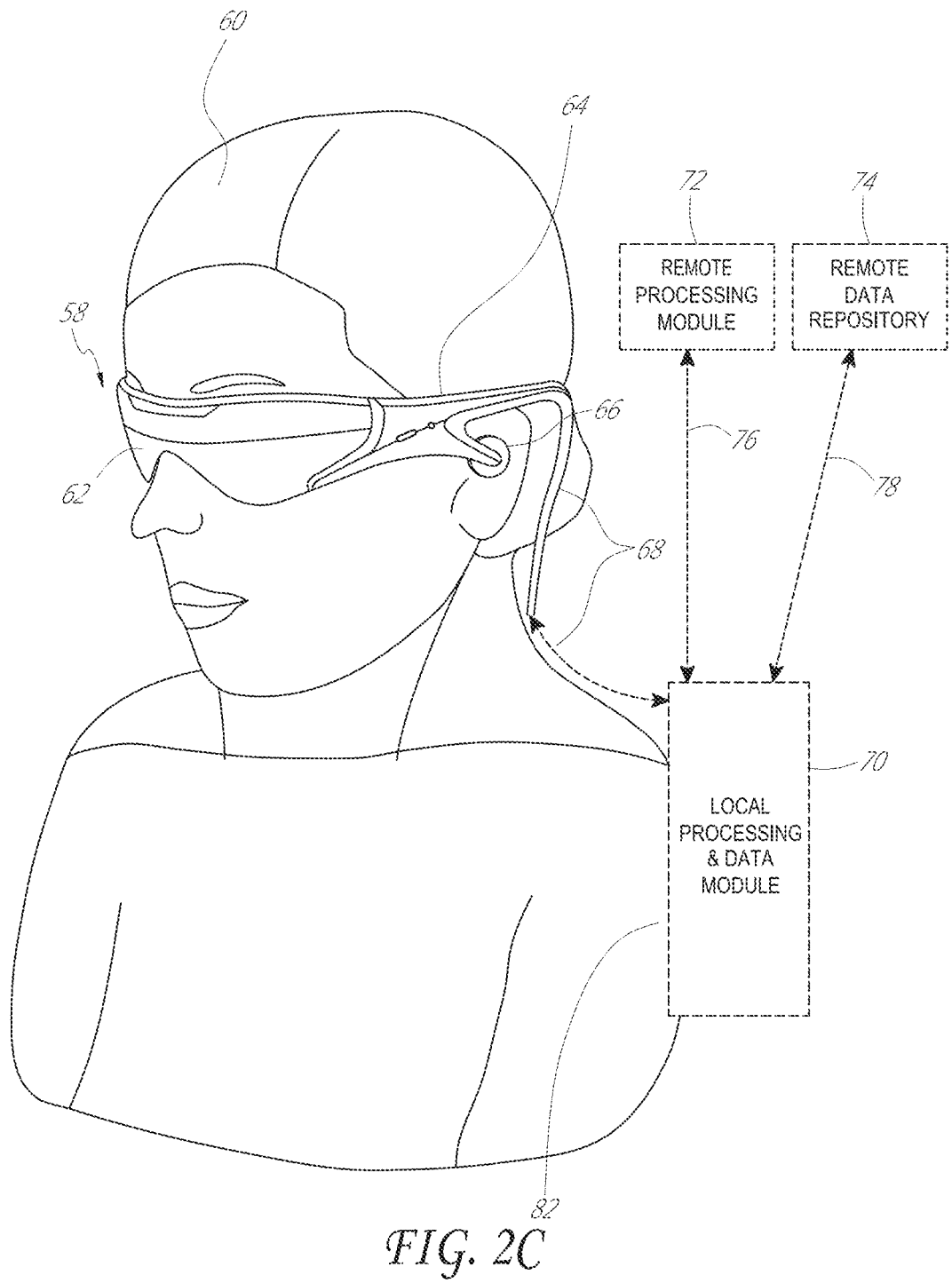
Figure 2D:
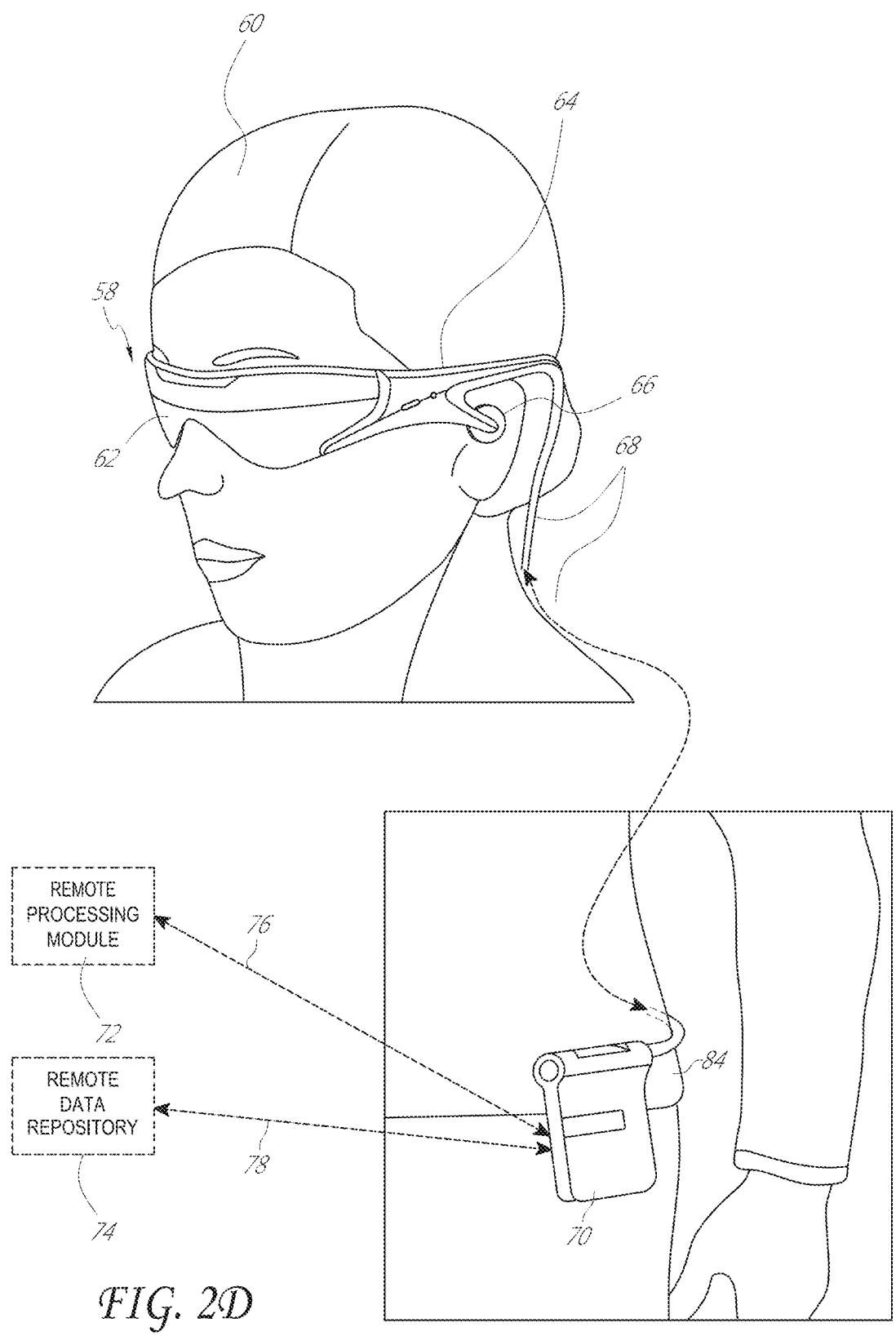

As shown in FIG. 2A, an AR system user (60) is depicted wearing head mounted component (58) featuring a frame (64) structure coupled to a display system (62) positioned in front of the eyes of the user. A speaker (66) is coupled to the frame (64) in the depicted configuration and positioned adjacent the ear canal of the user (in one embodiment, another speaker, not shown, is positioned adjacent the other ear canal of the user to provide for stereo/shapeable sound control). The display (62) is operatively coupled (68), such as by a wired lead or wireless connectivity, to a local processing and data module (70) which may be mounted in a variety of configurations, such as fixedly attached to the frame (64), fixedly attached to a helmet or hat (80) as shown in the embodiment of FIG. 2B, embedded in headphones, removably attached to the torso (82) of the user (60) in a backpack-style configuration as shown in the embodiment of FIG. 2C, or removably attached to the hip (84) of the user (60) in a belt-coupling style configuration as shown in the embodiment of FIG. 2D.

The local processing and data module (70) may include a power-efficient processor or controller, as well as digital memory, such as flash memory, both of which may be utilized to assist in the processing, caching, and storage of data a) captured from sensors which may be operatively coupled to the frame (64), such as image capture devices (such as cameras), microphones, inertial measurement units, accelerometers, compasses, GPS units, radio devices, and/or gyros; and/or b) acquired and/or processed using the remote processing module (72) and/or remote data repository (74), possibly for passage to the display (62) after such processing or retrieval. The local processing and data module (70) may be operatively coupled (76, 78), such as via a wired or wireless communication links, to the remote processing module (72) and remote data repository (74) such that these remote modules (72, 74) are operatively coupled to each other and available as resources to the local processing and data module (70).

In one embodiment, the remote processing module (72) may include one or more relatively powerful processors or controllers configured to analyze and process data and/or image information. In one embodiment, the remote data repository (74) may include a relatively large-scale digital data storage facility, which may be available through the internet or other networking configuration in a "cloud" resource configuration. In one embodiment, all data is stored and all computation is performed in the local processing and data module, allowing fully autonomous use from any remote modules.

Figure 3:
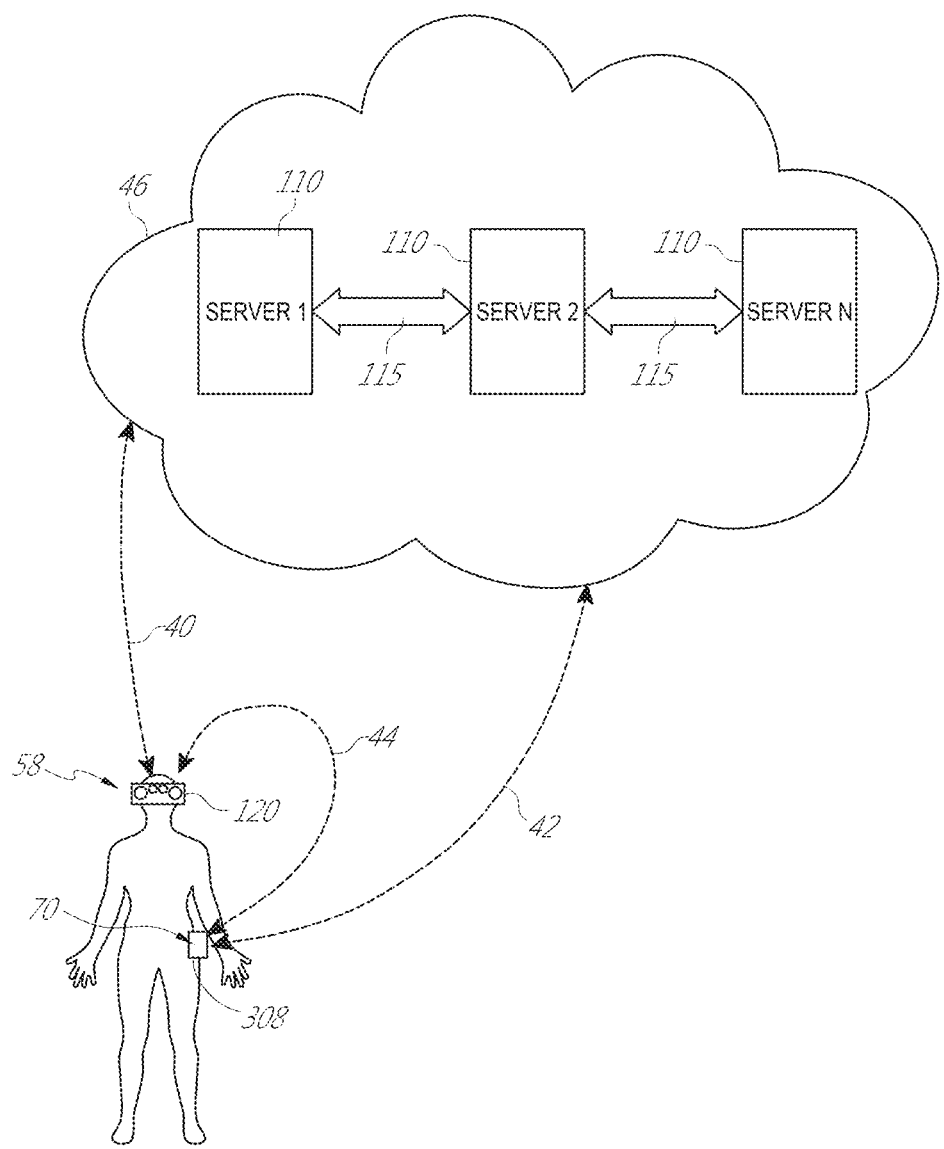
FIG. 3 schematically illustrates coordination between cloud computing assets and local processing assets.

Referring now to FIG. 3, a schematic illustrates coordination between the cloud computing assets (46) and local processing assets, which may, for example reside in head mounted componentry (58) coupled to the user's head (120) and a local processing and data module (70), coupled to the user's belt (308; therefore the component 70 may also be termed a "belt pack" 70), as shown in FIG. 3. In one embodiment, the cloud (46) assets, such as one or more server systems (110) are operatively coupled (115), such as via wired or wireless networking (wireless being preferred for mobility, wired being preferred for certain high-bandwidth or high-data-volume transfers that may be desired), directly to (40, 42) one or both of the local computing assets, such as processor and memory configurations, coupled to the user's head (120) and belt (308) as described above. These computing assets local to the user may be operatively coupled to each other as well, via wired and/or wireless connectivity configurations (44), such as the wired coupling (68) discussed below in reference to FIG. 8. In one embodiment, to maintain a low-inertia and small-size subsystem mounted to the user's head (120), primary transfer between the user and the cloud (46) may be via the link between the subsystem mounted at the belt (308) and the cloud, with the head mounted (120) subsystem primarily data-tethered to the belt-based (308) subsystem using wireless connectivity, such as ultra-wideband ("UWB") connectivity, as is currently employed, for example, in personal computing peripheral connectivity applications.

With efficient local and remote processing coordination, and an appropriate display device for a user, such as the user interface or user display system (62) shown in FIG. 2A, or variations thereof, aspects of one world pertinent to a user's current actual or virtual location may be transferred or "passed" to the user and updated in an efficient fashion. In other words, a map of the world may be continually updated at a storage location which may partially reside on the user's AR system and partially reside in the cloud resources. The map (also referred to as a "passable world model") may be a large database including raster imagery, 3-D and 2-D points, parametric information and other information about the real world. As more and more AR users continually capture information about their real environment (e.g., through cameras, sensors, IMUs, etc.), the map becomes more and more accurate and complete.

With a configuration as described above, wherein there is one world model that can reside on cloud computing resources and be distributed from there, such world can be "passable" to one or more users in a relatively low bandwidth form preferable to trying to pass around real-time video data or the like. The augmented experience of the person standing near the statue (e.g., as shown in FIG. 1) may be informed by the cloud-based world model, a subset of which may be passed down to them and their local display device to complete the view. A person sitting at a remote display device, which may be as simple as a personal computer sitting on a desk, can efficiently download that same section of information from the cloud and have it rendered on their display. Indeed, one person actually present in the park near the statue may take a remotely-located friend for a walk in that park, with the friend joining through virtual and augmented reality. The system will need to know where the street is, wherein the trees are, where the statue is—but with that information on the cloud, the joining friend can download from the cloud aspects of the scenario, and then start walking along as an augmented reality local relative to the person who is actually in the park.

Three-dimensional (3-D) points may be captured from the environment, and the pose (e.g., vector and/or origin position information relative to the world) of the cameras that capture those images or points may be determined, so that these points or images may be "tagged", or associated, with this pose information. Then points captured by a second camera may be utilized to determine the pose of the second camera. In other words, one can orient and/or localize a second camera based upon comparisons with tagged images from a first camera. Then this knowledge may be utilized to extract textures, make maps, and create a virtual copy of the real world (because then there are two cameras around that are registered).

So at the base level, in one embodiment a person-worn system can be utilized to capture both 3-D points and the 2-D images that produced the points, and these points and images may be sent out to a cloud storage and processing resource. They may also be cached locally with embedded pose information (e.g., cache the tagged images); so the cloud may have on the ready (e.g., in available cache) tagged 2-D images (e.g., tagged with a 3-D pose), along with 3-D points. If a user is observing something dynamic, he may also send additional information up to the cloud pertinent to the motion (for example, if looking at another person's face, the user can take a texture map of the face and push that up at an optimized frequency even though the surrounding world is otherwise basically static). More information on object recognizers and the passable world model may be found in U.S. Patent Pub. No. 2014/0306866, entitled "System and method for augmented and virtual reality", which is incorporated by reference in its entirety herein, along with the following additional disclosures, which related to augmented and virtual reality systems such as those developed by Magic Leap, Inc. of Plantation, Florida: U.S. Patent Pub. No. 2015/0178939; U.S. Patent Pub. No. 2015/0205126; U.S. Patent Pub. No. 2014/0267420; U.S. Patent Pub. No. 2015/0302652; U.S. Patent Pub. No. 2013/0117377; and U.S. Patent Pub. No. 2013/0128230, each of which is hereby incorporated by reference herein in its entirety.

GPS and other localization information may be utilized as inputs to such processing. Highly accurate localization of the user's head, totems, hand gestures, haptic devices etc. may be advantageous in order to display appropriate virtual content to the user.

The head-mounted device (58) may include displays positionable in front of the eyes of the wearer of the device. The displays may include light field displays. The displays may be configured to present images to the wearer at a plurality of depth planes. The displays may include planar waveguides with diffraction elements. Examples of displays, head-mounted devices, and other AR components usable with any of the embodiments disclosed herein are described in U.S. Patent Publication No. 2015/0016777. U.S. Patent Publication No. 2015/0016777 is hereby incorporated by reference herein in its entirety.

Examples of Electromagnetic Localization

One approach to achieve high precision localization may involve the use of an electromagnetic (EM) field coupled with EM sensors that are strategically placed on the user's AR head set, belt pack, and/or other ancillary devices (e.g., totems, haptic devices, gaming instruments, etc.). EM tracking systems typically include at least an EM field emitter (sometimes referred to as a transmitter or emitter generally) and at least one EM field sensor (sometimes referred to as a receiver or sensor generally). The EM emitter generates an EM field having a known spatial (and/or temporal) distribution in the environment of wearer of the AR headset. The EM field sensors measure the generated EM fields at the locations of the sensors. Based on these measurements and knowledge of the distribution of the generated EM field, a pose (e.g., a position and/or orientation) of a field sensor relative to the emitter may be determined. Accordingly, the pose of an object to which the sensor is attached may be determined.

EM tracking may be a promising approach for localization and tracking of objects in multiple domains, including applications in AR, VR, medicine, sports, manufacturing and gaming. A possible advantage of EM localization over some other methods using optical imaging techniques is that EM tracking can localize objects in the presence of occlusions (e.g., where a first object is in front of a second object and at least partially blocks the second object from view of an imaging system). EM tracking can also offer good dynamic response time, and may not require performance of complex image processing and computer vision techniques sometimes implemented with camera methods. Camera-based tracking systems may require dedicated algorithms and hardware for their high computational workload and may also lack robustness against fast motion dynamics and occlusions. In AR and VR applications, the processor (e.g., the local processing and data module 70) performs many computationally-intensive tasks (e.g., rendering virtual content to the user as described with reference to FIG. 1), as well as performing many of these tasks in real time. Therefore, reducing the computational complexity of tasks performed by the processor may be advantageous in AR and VR applications, and the usage of EM tracking systems can also be advantageous in offloading tasks from the processor.

Figure 4:
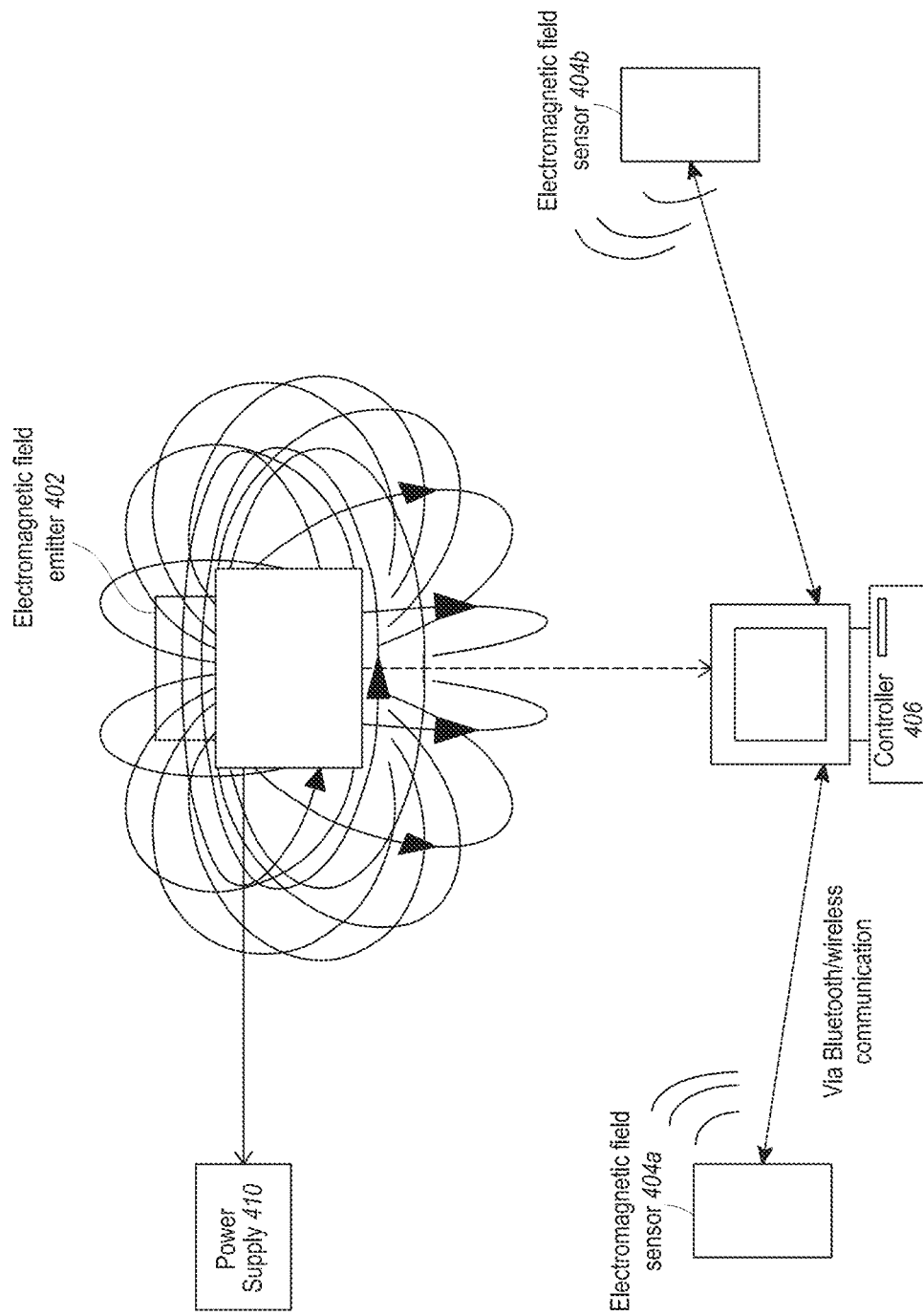
FIG. 4 schematically illustrates an example system diagram of an electromagnetic (EM) tracking system.

Referring now to FIG. 4, an example system diagram of an EM tracking system (e.g., such as those developed by organizations such as the Biosense division of Johnson & Johnson Corporation, Polhemus, Inc. of Colchester, Vermont, manufactured by Sixense Entertainment, Inc. of Los Gatos, California, and other tracking companies) is illustrated. In one or more embodiments, the EM tracking system includes an EM emitter 402 (which sometimes may be referred to as an EM field emitter or simply an emitter), which is configured to emit a known magnetic field. As shown in FIG. 4, the EM emitter may be coupled to a power supply (e.g., electric current, batteries, etc.) to provide power to the emitter 402.

In one or more embodiments, the EM emitter 402 includes several coils (e.g., at least three coils positioned perpendicular to each other to produce field in the X, Y and Z directions) that generate magnetic fields. This magnetic field is used to establish a coordinate space (e.g., an X-Y-Z Cartesian coordinate space). This allows the system to map a position of the sensors (e.g., an (X,Y,Z) position) in relation to the known magnetic field, and helps determine a position and/or orientation of the sensors. In one or more embodiments, the EM sensors 404a, 404b, etc. may be attached to one or more real objects. The EM sensors 404 (which sometimes may be referred to as EM field sensors or simply sensors) may include smaller coils in which current may be induced through the emitted EM field. Generally the "sensor" components (404) may include small coils or loops, such as a set of three differently-oriented (e.g., such as orthogonally oriented relative to each other) coils coupled together within a small structure such as a cube or other container, that are positioned/oriented to capture incoming magnetic flux from the magnetic field emitted by the emitter (402), and by comparing currents induced through these coils, and knowing the relative positioning and orientation of the coils relative to each other, relative position and orientation of a sensor relative to the emitter may be calculated.

Figure 6:
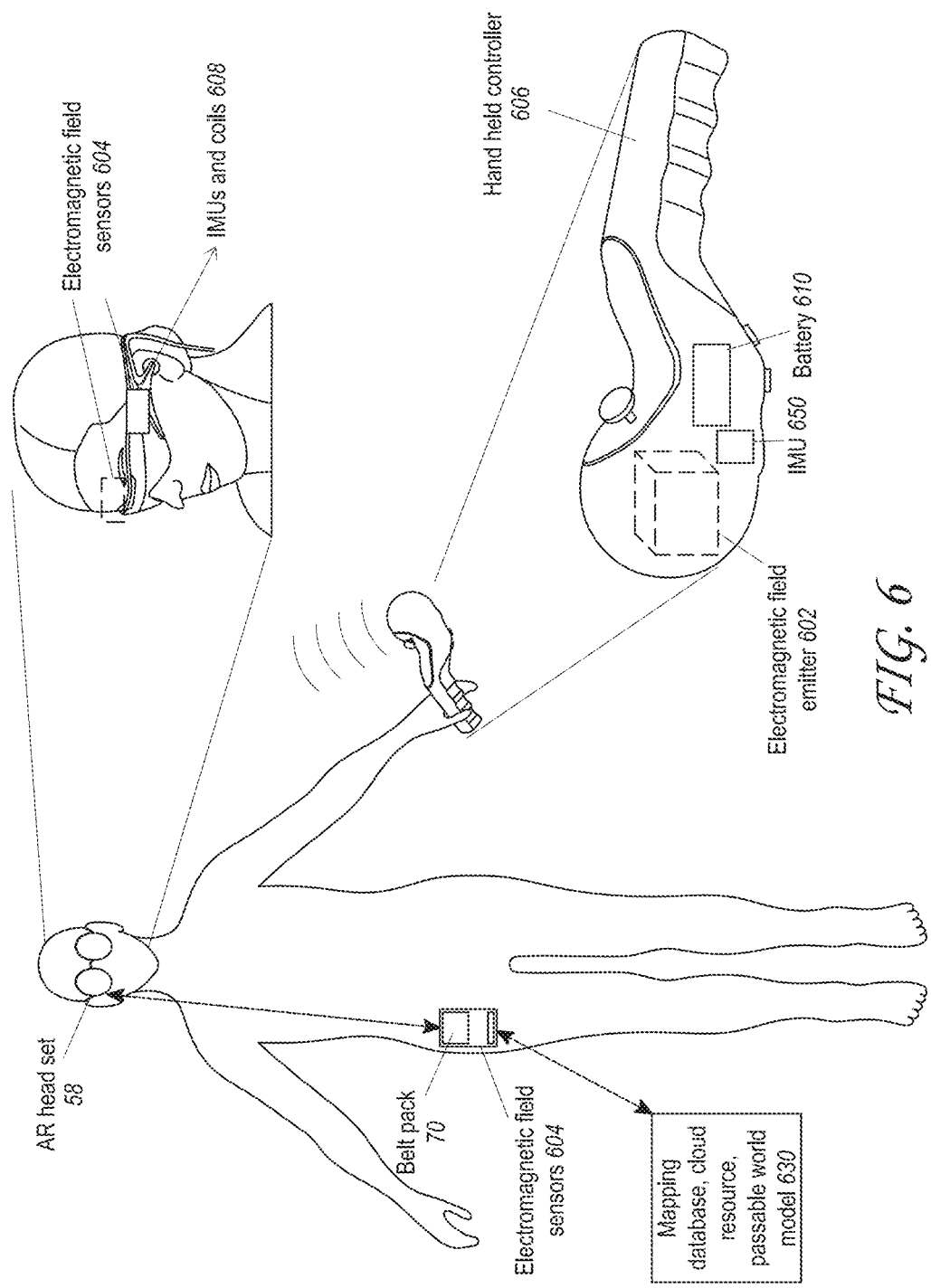
FIG. 6 schematically illustrates an example of an EM tracking system incorporated with an AR system.

One or more parameters pertaining to a behavior of the coils and inertial measurement unit ("IMU") components operatively coupled to the EM tracking sensors may be measured to detect a position and/or orientation of the sensor (and the object to which it is attached to) relative to a coordinate system to which the EM emitter is coupled. In one or more embodiments, multiple sensors may be used in relation to the EM emitter to detect a position and orientation of each of the sensors within the coordinate space. The EM tracking system may provide positions in three directions (e.g., X, Y and Z directions), and further in two or three orientation angles (e.g., yaw, pitch, and roll). For example, the EM tracking system may determine a six degree-of-freedom (6DOF) pose including three spatial coordinates (e.g., X, Y, and Z) and three orientation angles (e.g., yaw, pitch, and roll). In one or more embodiments, measurements of the IMU may be compared to the measurements of the coil to determine a position and orientation of the sensors. In one or more embodiments, both EM data and IMU data, along with various other sources of data, such as cameras, depth sensors, and other sensors, may be combined to determine the position and orientation. This information may be transmitted (e.g., wireless communication, Bluetooth, etc.) to the controller 406. In one or more embodiments, pose (or position and orientation) may be reported at a relatively high refresh rate in conventional systems. Conventionally an EM emitter is coupled to a relatively stable and large object, such as a table, operating table, wall, or ceiling, and one or more sensors are coupled to smaller objects, such as medical devices, handheld gaming components, or the like. Alternatively, as described below in reference to FIG. 6, various features of the EM tracking system may be employed to produce a configuration wherein changes or deltas in position and/or orientation between two objects that move in space relative to a more stable global coordinate system may be tracked; in other words, a configuration is shown in FIG. 6 wherein a variation of an EM tracking system may be utilized to track position and orientation delta between a head-mounted component and a hand-held component, while head pose relative to the global coordinate system (say of the room environment local to the user) is determined otherwise, such as by simultaneous localization and mapping ("SLAM") techniques using outward-capturing cameras which may be coupled to the head mounted component of the system.

The controller 406 may control the EM field generator 402, and may also capture data from the various EM sensors 404. It should be appreciated that the various components of the system may be coupled to each other through any electro-mechanical or wireless/Bluetooth means. The controller 406 may also include data regarding the known magnetic field, and the coordinate space in relation to the magnetic field. This information is then used to detect the position and orientation of the sensors in relation to the coordinate space corresponding to the known EM field.

One advantage of EM tracking systems is that they produce highly accurate tracking results with minimal latency and high resolution. Additionally, the EM tracking system does not necessarily rely on optical trackers, and sensors/objects not in the user's line-of-vision may be easily tracked.

It should be appreciated that the strength of the EM field drops as a cubic function of distance r from a coil transmitter (e.g., EM emitter 402). Thus, an algorithm may be used based on a distance away from the EM emitter. The controller 406 may be configured with such algorithms to determine a position and orientation (e.g., a 6DOF pose) of the sensor/object at varying distances away from the EM emitter. Given the rapid decline of the strength of the EM field as the sensor moves farther away from the EM emitter, best results, in terms of accuracy, efficiency and low latency, may be achieved at closer distances. In typical EM tracking systems, the EM emitter is powered by electric current (e.g., plug-in power supply) and has sensors located within 20 ft radius away from the EM emitter. A shorter radius between the sensors and emitter may be more desirable in many applications, including AR applications.

Figure 5:
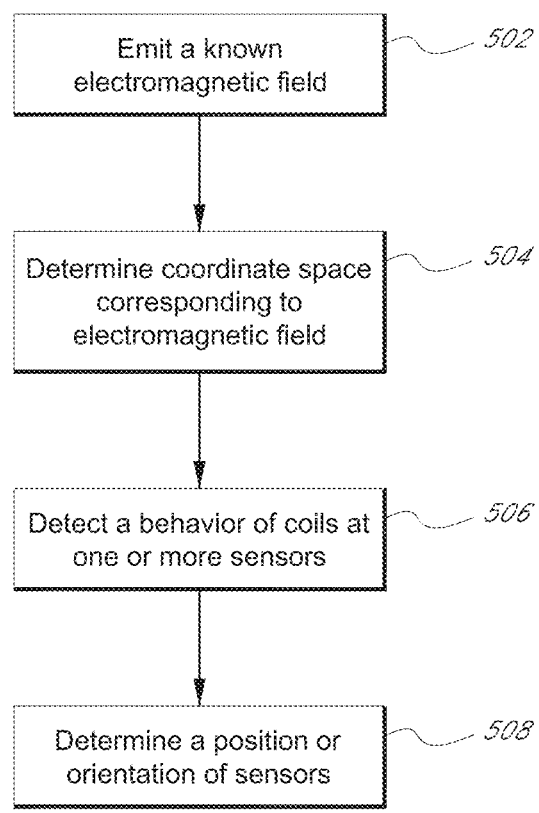
FIG. 5 is a flowchart describing example functioning of an embodiment of an EM tracking system.

Referring now to FIG. 5, an example flowchart describing a functioning of a typical EM tracking system is briefly described. At 502, a known EM field is emitted. In one or more embodiments, the magnetic emitter may generate magnetic fields each coil may generate an electric field in one direction (e.g., X, Y or Z). The magnetic fields may be generated with an arbitrary waveform. In one or more embodiments, the magnetic field component along each of the axes may oscillate at a slightly different frequency from other magnetic field components along other directions. At 504, a coordinate space corresponding to the EM field may be determined. For example, the control 406 of FIG. 4 may automatically determine a coordinate space around the emitter based on the EM field. At 506, a behavior of the coils at the sensors (which may be attached to a known object) may be detected. For example, a current induced at the coils may be calculated. In some embodiments, a rotation of coils, or any other quantifiable behavior may be tracked and measured. At 508, this behavior may be used to detect a position or orientation of the sensor(s) and/or known object. For example, the controller 406 may consult a mapping table that correlates a behavior of the coils at the sensors to various positions or orientations. Based on these calculations, the position in the coordinate space along with the orientation of the sensors may be determined. The order of the blocks in the flowchart in FIG. 5 is intended to be illustrative and not limiting. For example, the block 506 can be performed before the block 504 is performed, in some embodiments.

In the context of AR systems, one or more components of the EM tracking system may need to be modified to facilitate accurate tracking of mobile components. As described above, tracking the user's head pose and orientation may be desirable in many AR applications. Accurate determination of the user's head pose and orientation allows the AR system to display the right virtual content to the user. For example, the virtual scene may include a monster hiding behind a real building. Depending on the pose and orientation of the user's head in relation to the building, the view of the virtual monster may need to be modified such that a realistic AR experience is provided. Or, a position and/or orientation of a totem, haptic device or some other means of interacting with a virtual content may be important in enabling the AR user to interact with the AR system. For example, in many gaming applications, the AR system can detect a position and orientation of a real object in relation to virtual content. Or, when displaying a virtual interface, a position of a totem, user's hand, haptic device or any other real object configured for interaction with the AR system may be known in relation to the displayed virtual interface in order for the system to understand a command, etc. Conventional localization methods including optical tracking and other methods are typically plagued with high latency and low resolution problems, which makes rendering virtual content challenging in many augmented reality applications.

In one or more embodiments, the EM tracking system, discussed in relation to FIGS. 4 and 5 may be adapted to the AR system to detect position and orientation of one or more objects in relation to an emitted EM field. Typical EM systems tend to have a large and bulky EM emitters (e.g., 402 in FIG. 4), which is problematic for head-mounted AR devices. However, smaller EM emitters (e.g., in the millimeter range) may be used to emit a known EM field in the context of the AR system.

Referring now to FIG. 6, an EM tracking system may be incorporated with an AR system as shown, with an EM emitter 602 incorporated as part of a hand-held controller 606. The controller 606 may be movable independently relative to the AR headset (or the belt pack 70). For example, the user can hold the controller 606 in his or her hand, or the controller could be mounted to the user's hand or arm (e.g., as a ring or bracelet or as part of a glove worn by the user). In one or more embodiments, the hand-held controller may be a totem to be used in a gaming scenario (e.g., a multi-degree-of-freedom controller) or to provide a rich user experience in an AR environment or to allow user interaction with an AR system. In some embodiments, the hand-held controller may be a haptic device. In some embodiments, the EM emitter may simply be incorporated as part of the belt pack 70. The hand-held controller 606 may include a battery 610 or other power supply that powers that EM emitter 602. It should be appreciated that the EM emitter 602 may also include or be coupled to an IMU 650 component configured to assist in determining positioning and/or orientation of the EM emitter 602 relative to other components. This may be especially advantageous in cases where both the emitter 602 and the sensors (604) are mobile. Placing the EM emitter 602 in the hand-held controller rather than the belt pack, as shown in the embodiment of FIG. 6, helps ensure that the EM emitter is not competing for resources at the belt pack, but rather uses its own battery source at the hand-held controller 606. In some embodiments, the EM emitter 602 may be disposed on the AR headset 58 and the sensors 604 may be disposed on the controller 606 or belt pack 70.

In one or more embodiments, the EM sensors 604 may be placed on one or more locations on the user's headset, along with other sensing devices such as one or more IMUs or additional magnetic flux capturing coils 608. For example, as shown in FIG. 6, sensors (604, 608) may be placed on one or both sides of the head set (58). Since these sensors are engineered to be rather small (and hence may be less sensitive, in some cases), having multiple sensors may improve efficiency and precision. In one or more embodiments, one or more sensors may also be placed on the belt pack 70 or any other part of the user's body or in the hand held controller 606. The sensors (604, 608) may communicate wirelessly or through Bluetooth to a computing apparatus that determines a pose and orientation of the sensors (and the AR headset to which it is attached). In some embodiments, the computing apparatus may reside at the belt pack 70. In some embodiments, the computing apparatus may reside at the headset itself, or even the hand-held controller 606. The computing apparatus may in turn include a mapping database (e.g., passable world model, coordinate space, etc.) to detect pose, to determine the coordinates of real objects and virtual objects, and may even connect to cloud resources and the passable world model, in one or more embodiments.

As described above, conventional EM emitters may be too bulky for AR devices. Therefore the EM emitter may be engineered to be compact, using smaller coils compared to traditional systems. However, given that the strength of the EM field decreases as a cubic function of the distance away from the emitter, a shorter radius between the EM sensors 604 and the EM emitter 602 (e.g., about 3 to 3.5 ft) may reduce power consumption when compared to conventional systems such as the one detailed in FIG. 4.

This aspect may either be utilized to prolong the life of the battery 610 that may power the controller 606 and the EM emitter 602, in one or more embodiments. In some embodiments, this aspect may be utilized to reduce the size of the coils generating the magnetic field at the EM emitter 602. However, in order to get the same strength of magnetic field, the power may be need to be increased. This allows for a compact EM emitter unit 602 that may fit compactly at the hand-held controller 606.

Several other changes may be made when using the EM tracking system for AR devices. Although this pose reporting rate is rather good, AR systems may require an even more efficient pose reporting rate. To this end, IMU-based pose tracking may (additionally or alternatively) be used in the sensors. Advantageously, the IMUs may remain as stable as possible in order to increase an efficiency of the pose detection process. The IMUs may be engineered such that they remain stable up to 50-100 milliseconds. It should be appreciated that some embodiments may utilize an outside pose estimator module (e.g., IMUs may drift over time) that may enable pose updates to be reported at a rate of 10 to 20 Hz. By keeping the IMUs stable at a reasonable rate, the rate of pose updates may be dramatically decreased to 10 to 20 Hz (as compared to higher frequencies in conventional systems).

If the EM tracking system may be run at, for example, a 10% duty cycle (e.g., only pinging for ground truth every 100 milliseconds), this would be another way to save power at the AR system. This would mean that the EM tracking system wakes up every 10 milliseconds out of every 100 milliseconds to generate a pose estimate. This directly translates to power consumption savings, which may, in turn, affect size, battery life and cost of the AR device.

In one or more embodiments, this reduction in duty cycle may be strategically utilized by providing two hand-held controllers (not shown) rather than just one. For example, the user may be playing a game that requires two totems, etc. Or, in a multi-user game, two users may have their own totems/hand-held controllers to play the game. When two controllers (e.g., symmetrical controllers for each hand) are used rather than one, the controllers may operate at offset duty cycles. The same concept may also be applied to controllers utilized by two different users playing a multi-player game, for example.

Figure 7:
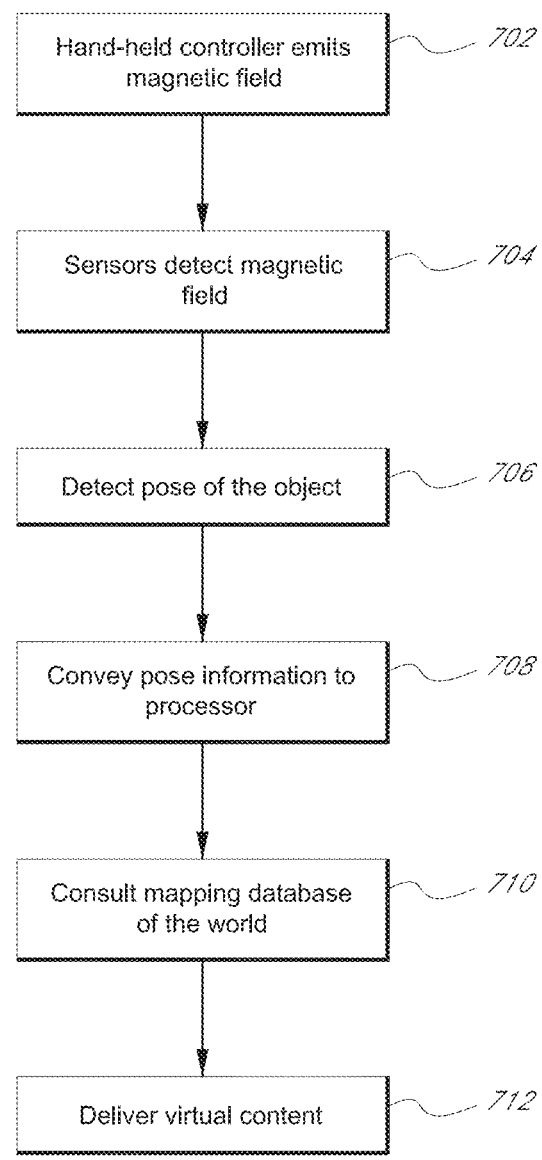
FIG. 7 is a flowchart describing functioning of an example of an EM tracking system in the context of an AR device.

Referring now to FIG. 7, an example flow chart describing the EM tracking system in the context of AR devices is described. At 702, a portable (e.g., hand-held) controller containing an EM emitter emits a magnetic field. At 704, the EM sensors (e.g., placed on headset, belt pack, etc.) detect the magnetic field. At 706, a pose (e.g., position or orientation) of the headset/belt is determined based on a behavior of the coils/IMUs at the sensors. The pose may include a 6DOF pose or have fewer than all six degrees of freedom (e.g., one or more spatial coordinates or one or more orientation angles). At 708, the pose information is conveyed to the computing apparatus (e.g., at the belt pack or headset). At 710, optionally, a mapping database (e.g., passable world model) may be consulted to correlate the real world coordinates (e.g., determined for the pose of the headset/belt) with the virtual world coordinates. At 712, virtual content may be delivered to the user at the AR headset and displayed to the user (e.g., via the light field displays described herein). It should be appreciated that the flowchart described above is for illustrative purposes only, and should not be read as limiting.

Advantageously, using an EM tracking system similar to the one outlined in FIG. 6 enables low latency pose tracking (e.g., head position or orientation, position and orientation of totems, belt packs, and other controllers). This allows the AR system to project virtual content (based at least in part on the determined pose) with a higher degree of accuracy, and very low latency when compared to optical tracking techniques.

Figure 8:
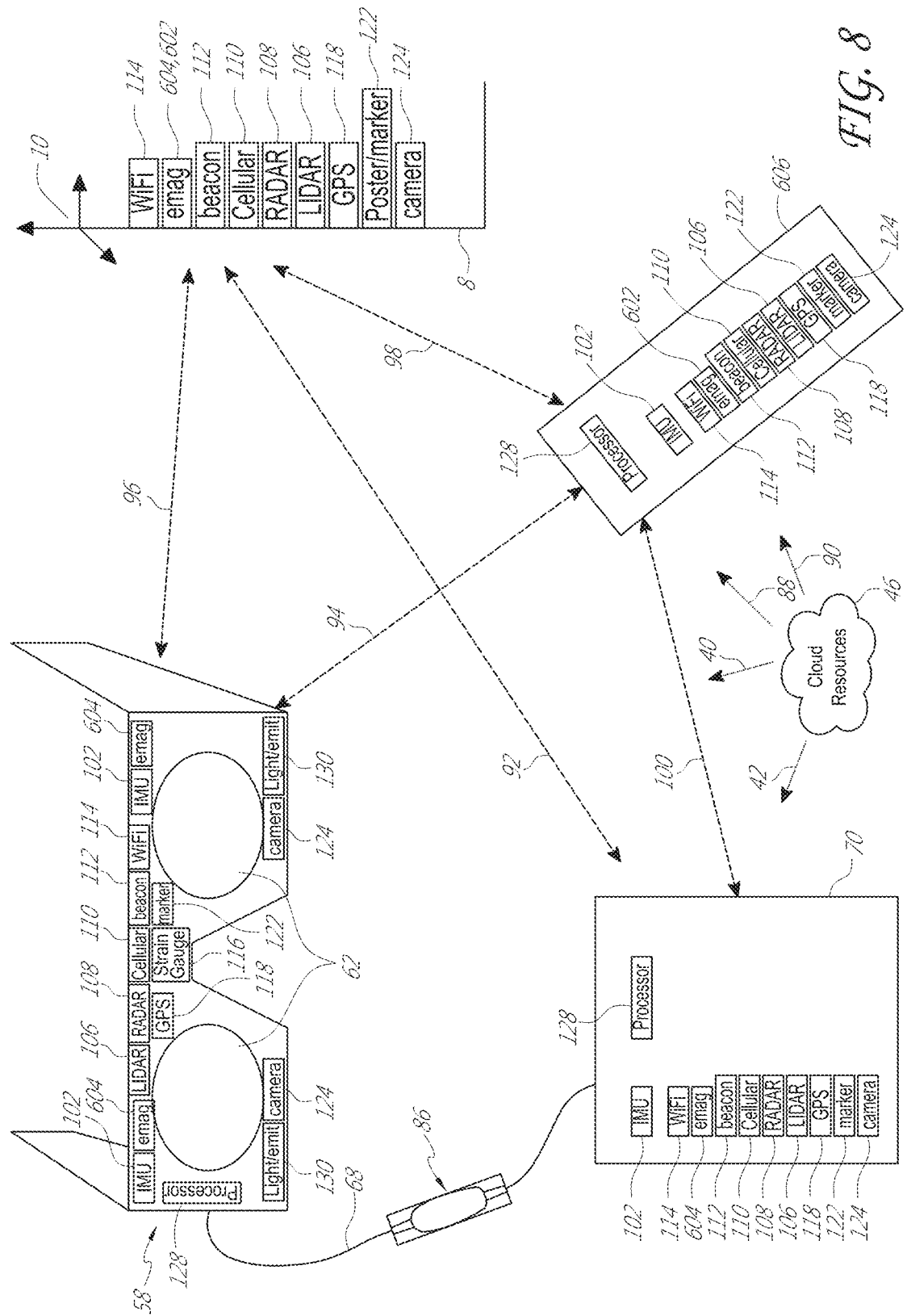
FIG. 8 schematically illustrates examples of components of an embodiment of an AR system.

Referring to FIG. 8, a system configuration is illustrated wherein featuring many sensing components. A head mounted wearable component (58) is shown operatively coupled (68) to a local processing and data module (70), such as a belt pack, here using a physical multicore lead which also features a control and quick release module (86). The control and quick release module (86) can include buttons for operation of the associated system, for example, an on/off button and up/down volume controls. Opposing ends of the module (86) may be connected to electrical leads running between the local processing and data module (70) and the display (62) as shown in FIG. 8.

The local processing and data module (70) is operatively coupled (100) to a hand held component (606), here by a wireless connection such as low power Bluetooth; the hand held component (606) may also be operatively coupled (94) directly to the head mounted wearable component (58), such as by a wireless connection such as low power Bluetooth. Generally where IMU data is passed to coordinate pose detection of various components, a high-frequency connection is desirable, such as in the range of hundreds or thousands of cycles/second or higher; tens of cycles per second may be adequate for EM localization sensing, such as by the sensor (604) and transmitter (602) pairings. Also shown is a global coordinate system (10), representative of fixed objects in the real world around the user, such as a wall (8).

Cloud resources (46) also may be operatively coupled (42, 40, 88, 90) to the local processing and data module (70), to the head mounted wearable component (58), to resources which may be coupled to the wall (8) or other item fixed relative to the global coordinate system (10), respectively. The resources coupled to the wall (8) or having known positions and/or orientations relative to the global coordinate system (10) may include a wireless transceiver (114), an EM emitter (602) and/or receiver (604), a beacon or reflector (112) configured to emit or reflect a given type of radiation, such as an infrared LED beacon, a cellular network transceiver (110), a RADAR emitter or detector (108), a LIDAR emitter or detector (106), a GPS transceiver (118), a poster or marker having a known detectable pattern (122), and a camera (124).

The head mounted wearable component (58) features similar components, as illustrated, in addition to lighting emitters (130) configured to assist the camera (124) detectors, such as infrared emitters (130) for an infrared camera (124); also featured on the head mounted wearable component (58) are one or more strain gauges (116), which may be fixedly coupled to the frame or mechanical platform of the head mounted wearable component (58) and configured to determine deflection of such platform in between components such as EM receiver sensors (604) or display elements (62), wherein it may be valuable to understand if bending of the platform has occurred, such as at a thinned portion of the platform, such as the portion above the nose on the eyeglasses-like platform depicted in FIG. 8.

The head mounted wearable component (58) also features a processor (128) and one or more IMUs (102). Each of the components preferably are operatively coupled to the processor (128), which can include a hardware controller, hardware microprocessor, application specific integrated circuit (ASIC), etc. The hand held component (606) and local processing and data module (70) are illustrated featuring similar components. As shown in FIG. 8, with so many sensing and connectivity means, such a system is likely to be heavy, power hungry, large, and relatively expensive. However, for illustrative purposes, such a system may be utilized to provide a very high level of connectivity, system component integration, and position/orientation tracking. For example, with such a configuration, the various main mobile components (58, 70, 606) may be localized in terms of position relative to the global coordinate system using WiFi, GPS, or Cellular signal triangulation; beacons, EM tracking (as described herein), RADAR, and LIDAR systems may provide yet further location and/or orientation information and feedback. Markers and cameras also may be utilized to provide further information regarding relative and absolute position and orientation. For example, the various camera components (124), such as those shown coupled to the head mounted wearable component (58), may be utilized to capture data which may be utilized in simultaneous localization and mapping protocols, or "SLAM", to determine where the component (58) is and how it is oriented relative to other components.

In some embodiments, in addition or as an alternative to a LIDAR (106) type of depth sensor, the system includes a generic depth camera or depth sensor, which may, for example, be either a stereo triangulation style depth sensor (such as a passive stereo depth sensor, a texture projection stereo depth sensor, or a structured light stereo depth sensor) or a time or flight style depth sensor (such as a LIDAR depth sensor or a modulated emission depth sensor); further, the system may include an additional forward facing "world" camera (124, which may be a grayscale camera, having a sensor capable of 720p range resolution) as well as a relatively high-resolution "picture camera" (which may be a full color camera, having a sensor capable of two megapixel or higher resolution, for example).

Example Electromagnetic Sensing Components in an AR system

Figure 9A:
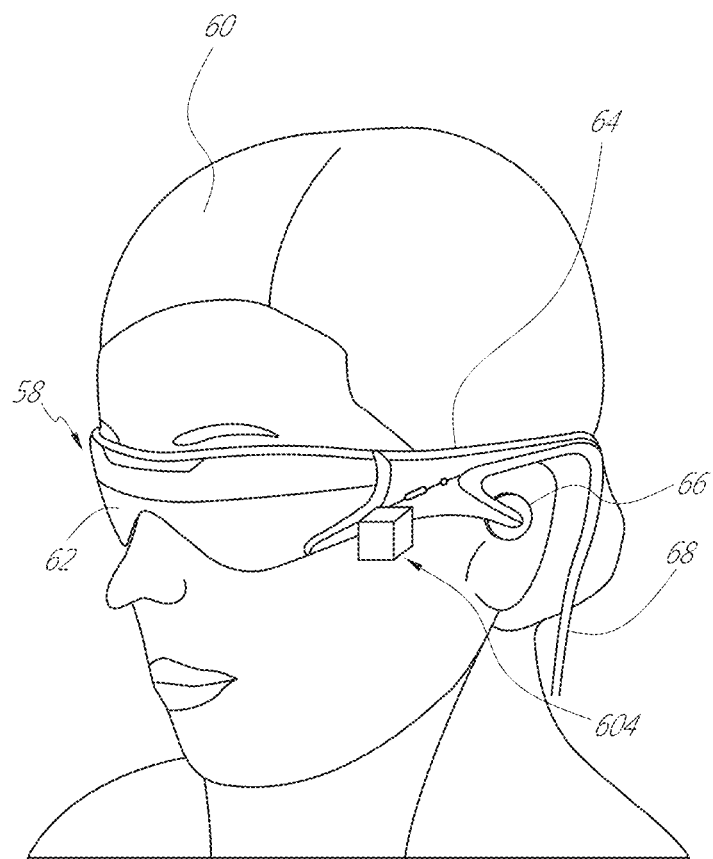
FIGS. 9A and 9B schematically illustrate examples of EM sensing coils coupled to a head-mounted display.
Figure 9B:
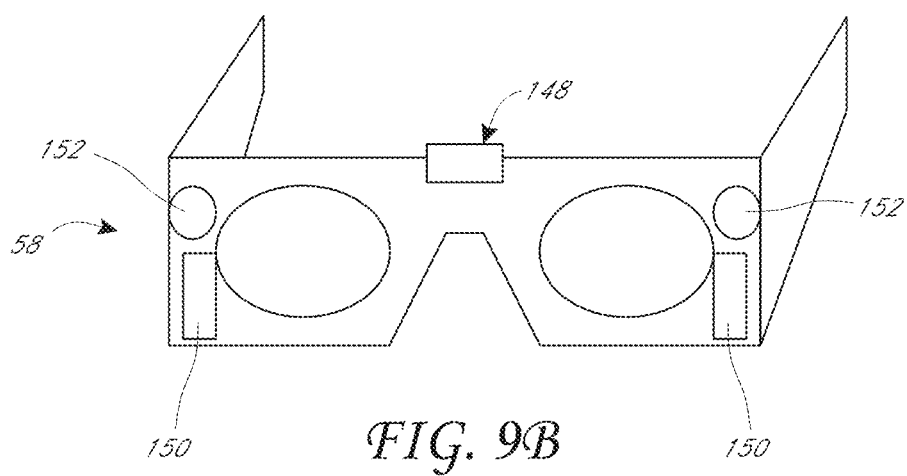

Referring to FIG. 9A, an EM sensing coil assembly (604, e.g., 3 individual coils coupled to a housing) is shown coupled to a head mounted component (58); such a configuration adds additional geometry to the overall assembly which may not be desirable. Referring to FIG. 9B, rather than housing the coils in a box or single housing 604 as in the configuration of FIG. 9A, the individual coils may be integrated into the various structures of the head mounted component (58), as shown in FIG. 9B. FIG. 9B shows examples of locations on the head-mounted display 58 for X-axis coils (148), Y-axis coils (150), and Z-axis coils (152). Thus, the sensing coils may be distributed spatially on or about the head-mounted display (58) to provide a desired spatial resolution or accuracy of the localization and/or orientation of the display (58) by the EM tracking system.

Referring again to FIG. 9B, a distributed sensor coil configuration is shown for the AR device 58. The AR device 58 can have a single EM sensor device (604), such as a housing containing three orthogonal sensing coils, one for each direction of X, Y, Z, which may be coupled to the wearable component (58) for 6 degree of freedom (6DOF) tracking, as described herein. Also as noted above, such a device may be disintegrated, with the three sub-portions (e.g., coils) attached at different locations of the wearable component (58), as shown in FIG. 9B. To provide further design alternatives, each individual sensor coil may be replaced with a group of similarly oriented coils, such that the overall magnetic flux for any given orthogonal direction is captured by the group rather than by a single coil for each orthogonal direction. In other words, rather than one coil for each orthogonal direction, a group of smaller coils may be utilized and their signals aggregated to form the signal for that orthogonal direction. In some embodiments wherein a particular system component, such as a head mounted component (58) features two or more EM coil sensor sets, the system may be configured to selectively utilize the sensor and emitter pairing that are closest to each other (e.g., within 1 cm, 2 cm, 3 cm, 4 cm, 5 cm, or 10 cm) to improve or optimize the performance of the system. In some embodiments, the EM emitter(s) and the EM sensor(s) can be arranged differently. For example, the EM emitter(s) can be disposed in or on the head mounted component (58), and the EM sensor(s) can be disposed in or on the hand held controller (606) or the belt pack (70). As another example, the EM sensor(s) can be disposed in or on the head mounted component (58), and the EM emitter(s) can be disposed in or on the hand held controller (606) or the belt pack (70). As yet another example, the EM emitter(s) can be disposed in or on the belt (70), and the EM sensor(s) can be disposed in or on the hand held controller (606) or the head mounted component (58).

EM tracking updating may be relatively "expensive" in terms of power for a portable system, and may not be capable of very high frequency updating. In a "sensor fusion" configuration, more frequently updated localization information from another sensor such as an IMU may be combined, along with data from another sensor, such as an optical sensor (e.g., a camera or a depth camera), which may or may not be at a relatively high frequency; the net of fusing all of these inputs may place a lower demand upon the EM system and provides for quicker updating.

Examples of EM Tracking of User Head Pose or Hand Pose

Figure 10:
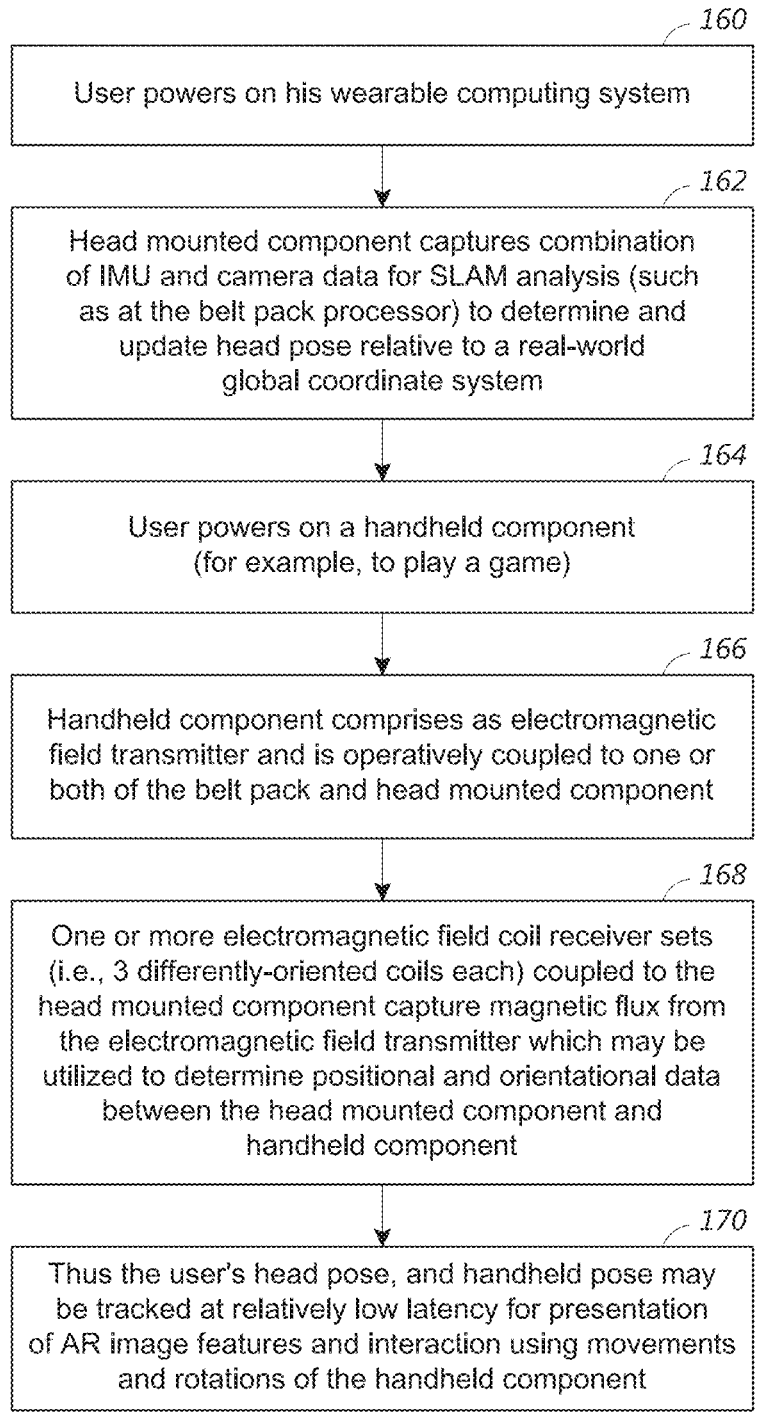
FIGS. 10 and 11 are flowcharts that illustrate examples of pose tracking with an EM tracking system in a head-mounted AR system.

Referring to FIG. 10, in one embodiment, after a user powers up his or her wearable computing system (160), a head mounted component assembly may capture a combination of IMU and camera data (the camera data being used, for example, for SLAM analysis, such as at the belt pack processor where there may be more raw processing horsepower present) to determine and update head pose (e.g., position or orientation) relative to a real world global coordinate system (162). The user may also activate a handheld component to, for example, play an augmented reality game (164), and the handheld component may include an EM transmitter operatively coupled to one or both of the belt pack and head mounted component (166). One or more EM field coil receiver sets (e.g., a set being 3 differently-oriented individual coils) coupled to the head mounted component to capture magnetic flux from the transmitter, which may be utilized to determine positional or orientational difference (or "delta"), between the head mounted component and handheld component (168). The combination of the head mounted component assisting in determining pose relative to the global coordinate system, and the hand held assisting in determining relative location and orientation of the handheld relative to the head mounted component, allows the system to generally determine where each component is relative to the global coordinate system, and thus the user's head pose, and handheld pose may be tracked, preferably at relatively low latency, for presentation of augmented reality image features and interaction using movements and rotations of the handheld component (170).

Figure 11:
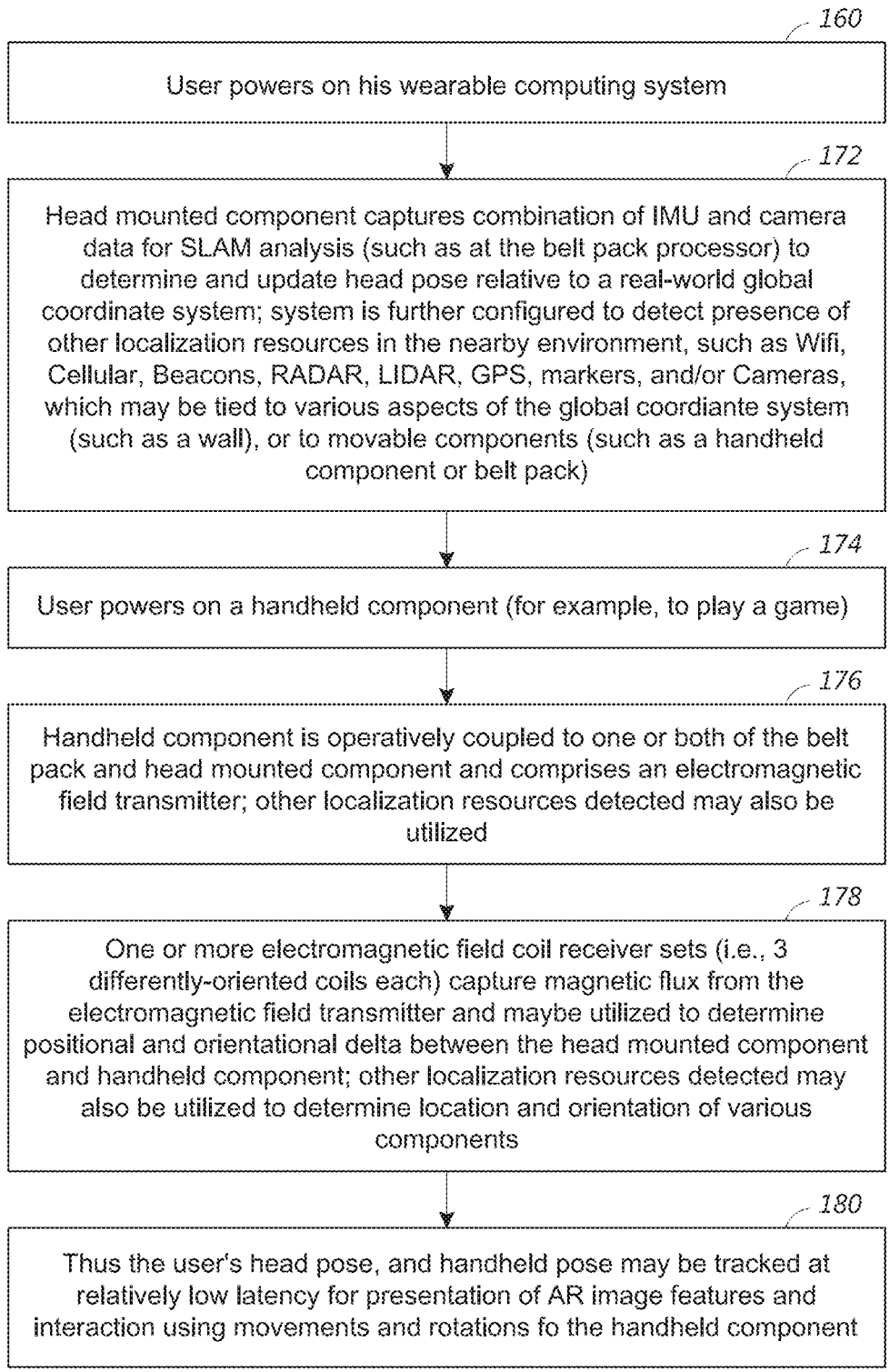

Referring to FIG. 11, an embodiment is illustrated that is somewhat similar to that of FIG. 10, with the exception that the system has many more sensing devices and configurations available to assist in determining pose of both the head mounted component (172) and a hand held component (176, 178), such that the user's head pose, and handheld pose may be tracked, preferably at relatively low latency, for presentation of augmented reality image features and interaction using movements and rotations of the handheld component (180).

In various implementations, the augmented reality device can include a computer vision system configured to implement one or more computer vision techniques to identify objects in the environment of the system, user gestures, or perform other computer vision procedures used or described herein. For example, as described below, the computer vision system can analyze images of the user input device 606 taken by an outward-facing camera 124 to determine the pose (e.g., position or orientation) of the device for use in compensating for EM distortion in an electromagnetic tracking system. Non-limiting examples of computer vision techniques include: Scale-invariant feature transform (SIFT), speeded up robust features (SURF), oriented FAST and rotated BRIEF (ORB), binary robust invariant scalable keypoints (BRISK), fast retina keypoint (FREAK), Viola-Jones algorithm, Eigenfaces approach, Lucas-Kanade algorithm, Horn-Schunk algorithm, Mean-shift algorithm, visual simultaneous location and mapping (vSLAM) techniques, a sequential Bayesian estimator (e.g., Kalman filter, extended Kalman filter, etc.), bundle adjustment, Adaptive thresholding (and other thresholding techniques), Iterative Closest Point (ICP), Semi Global Matching (SGM), Semi Global Block Matching (SGBM), Feature Point Histograms, various machine learning algorithms (such as e.g., support vector machine, k-nearest neighbors algorithm, Naive Bayes, neural network (including convolutional or deep neural networks), or other supervised/unsupervised models, etc.), and so forth.

Overview of Electromagnetic Distortion in Electromagnetic Tracking Systems

One challenge in practical applications of EM tracking and localization is the occurrence of EM distortion due to ferromagnetic materials (e.g., iron, nickel, cobalt, and their alloys) present in the environment. Because EM localization uses magnetic fields, EM localization may be sensitive to the presence of metals and ferromagnetic materials in the environment that cause distortion of the EM localization fields generated by an EM emitter (e.g., the EM emitter 402). Further, alternating current (AC) magnetic fields in an EM tracking system can produce circulating eddy currents in nearby electrically conductive material, thereby generating secondary AC magnetic fields which further introduces EM distortion. Because the EM sensors may be located near electronics in AR or VR devices (see, e.g., FIGS. 6 and 8), distortions may be associated with the electronics.

To illustrate a degree of distortions from nearby objects, the following non-limiting, simplified model may be used. Ferromagnetic material alters the shape of magnetic fields surrounding the material. Because of the complexities of ferromagnetic structures in a general environment, analytical determination of the distortion caused by these ferromagnetic structures may be difficult. A useful limiting approximation may be made by assuming that an infinite conducting plane represents a worst case scenario for field distortion compared to any object at the same distances from a source (e.g., EM emitter) to a sensor (e.g., EM sensor). By using the theory of images, the infinite conducting plane may be replaced by an image source (for example, at twice the distance from the source to the infinite conducting plane) from which EM distortion may be modeled.

Based on this analysis, a rule of thumb is that an object at twice the distance separating the EM emitter and the EM sensor may produce a distortion of about 1% or less compared to an EM field generated by the EM emitter. Accordingly, the distortion caused by distant ferromagnetic objects may be less if the distance separating the EM emitter and the EM sensor is small. Thus, for short distance applications where the EM sensor is located about one meter or less from the EM emitter, ferromagnetic materials located two meters (or more) away may introduce distortions of about 1% or less compared to the EM field generated by the EM emitter.

Ferromagnetic objects closer than twice the distance separating the EM emitter and the EM sensor may produce more sizeable EM distortion, and embodiments of EM distortion correction technology described herein may be used to correct for the EM distortion in real time, which thereby provide more robust and accurate localization of the EM sensor relative to the EM emitter. AR or VR systems that utilize such EM distortion correction technology can provide an improved user experience, because the pose (e.g., position or orientation) of the user's head, hands, or other body parts in the AR/VR environment may be known more accurately.

In some illustrative, non-limiting implementations, the EM distortion correction technology may be described in two parts. The first part of the EM distortion correction technology includes modeling the EM distortion correction. A distorted magnetic field may be represented by a 3×3 matrix, and a pair of 3×3 matrices may be used to transforms the 3×3 matrix representing the distorted magnetic field back to its original form (without the EM distortions). The pair of 3×3 distortion correcting matrices may include up to 18 parameters (e.g., 2×3×3) which may be solved for using numerical or analytical techniques. Use of this distortion-correction model may result in a significant reduction in distortion in a ferromagnetically distorted environment. The second part of the EM distortion correction technology includes a fast-converging algorithm that can determine unknown distortion parameters within a few (e.g., two to four) iterations. Use of this algorithm may be advantageous in that it may allow distortion correction to be performed in real-time (e.g., by the local processing and data module 70), which may be advantageous especially for correcting for ambient distortions in an AR or VR environment, where movement of the user's head, hands, and hand-held controller (e.g., the hand-held controller 606) may cause ambient EM distortions to rapidly change.

Additionally or alternatively, a direct, closed-form solution for computation of six degree of freedom (6DOF) pose from EM localization data may be used. This solution will be described below and uses singular value decomposition (SVD) techniques, without resorting to numerical solution of nonlinear equations. This closed-form solution may provide a significant improvement in computational speed (as compared with numerical solutions) and may also avoid potential issues associated with using iterative numerical methods.

Overview of Electromagnetic Localization

EM localization is based on magnetic field coupling derived from excitation of magnetic fields by the EM emitter. There are two common ways of exciting the magnetic fields. One is based on a pulsed alternating current (AC) field, and the other is based on a pulsed direct current (DC) field. At present, EM tracking systems utilizing an AC EM field are more common, because they tend to be less sensitive to noise. As described with reference to FIGS. 9A and 9B, for 6DOF localization, the EM sensor (e.g., the EM sensor 604) and the EM emitter (e.g., the EM emitter 602) can each include three orthogonally-aligned coils (e.g., along respective X, Y, Z axes). In many applications using this configuration, the emitter coil currents in the EM emitter 602 are pulsed sequentially (e.g., in X, then in Y, and then in Z), and the resultant magnetic fields induce currents in each sensor coil in the EM sensor 604 that are then used to determine the position or orientation of the sensor coil relative to the emitter coil and thus the EM sensor 604 relative to the EM emitter 602.

Without being bound or limited by the following theoretical development, an EM model for EM localization will now be presented. In this model, the magnetic field generated by the emitter coils in the EM emitter 602 is assumed to be an equivalent magnetic dipole field (which tends to be accurate when the size of the emitter coils in the EM emitter 602 is smaller than the distance between the emitter coils and sensor coils). The magnetic field may be described by:

$$H_r = \frac{M}{2\pi r^3} \cos \zeta,$$

$$H_t = \frac{M}{2\pi r^3} \sin \zeta,$$

where $H_r$ is a radial component of the magnetic field, $H_t$ is a tangential component of the magnetic field, M is a magnetic moment at the EM emitter, r is a distance between the EM emitter 602 and the EM sensor 604, and cis a pitch angle of a position of the EM sensor 604 with respect to a plane of symmetry of the EM emitter 602.

The equations for 6DOF localization use Euler angle transformations to describe the position and orientation of the EM sensor 604 with respect to the EM emitter 602. The EM field sensed by the EM sensor 604 may be represented by a matrix equation:

$$F = \frac{c}{r^3} T\ P^{-1}\ KPE,$$

(3)

where F is a 3×3 EM field matrix, c is a constant for any given coil configuration (e.g., proportional to a product of a number of loops of wire, an area of the loops, and a sensor gain), r is the distance between the EM emitter 602 and the EM sensor 604, T is a 3×3 rotation matrix representing a 3 degree of freedom (3DOF) orientation of the EM sensor 604 with respect to the EM emitter 602, P is a 3×3 rotation matrix representing the position of the EM sensor 604 with respect to the EM emitter 602, K is a 3×3 diagonal matrix with diagonal elements proportional to $[1, -\frac{1}{2}, -\frac{1}{2}]$, and E is a 3×3 diagonal matrix where diagonal elements represent the strengths of the three orthogonal emitter coils of the EM emitter 602.

The matrix P may be represented in terms of an azimuthal angle $\theta$ and a pitch $\varphi$ by:

$$P = roty(\varphi)\ rotz(\theta), \qquad (4)$$

where roty is a 3×3 rotation matrix around the Y-axis and rotz is a 3×3 rotation matrix around the Z-axis.

As the elements of the matrices involve trigonometric functions, Equation (3) is actually a system of simultaneous nonlinear equations with six unknowns (three position variables and three orientation variables), which have to be solved simultaneously to get the 6DOF pose of the EM sensor 604 with respect to the EM emitter 602. Iterative numerical solution methods may face several problems. Aside from longer computation time, there is a potential risk of terminating the iteration at a local minimum, instead of the intended solution, especially when noise and distortion are present. Also, because the magnitude of magnetic field may be the same at different locations, such as at positions of symmetry, iterative numerical methods risk providing results on the other side of the octant, or coordinates with incorrect signs. This is especially true when finding positions of a sensor that is not in motion. Accordingly, some implementations of the EM distortion correction technology use a direct, closed-form solution described below to solve Equation (3).

Example Distortion Mapping Scheme

For an EM field with EM distortion, a distorted EM field matrix $F_d$ may be represented as:

$$F_d = D_L F D_R, \quad (5)$$

where F is an undistorted EM field matrix (see, e.g., Equation (3)) and $D_L$ and $D_R$ are a pair of 3×3 distortion matrices.

To remove distortion, a pair of 3×3 EM distortion compensating matrices and $C_L$ and $C_R$ may be determined such that the undistorted EM field may be found from:

$$F = C_L F_d C_R \quad (6)$$
$$= (C_L D_L) F (D_R C_R),$$

where the second equality in Equation (6) follows from Equation (5). The second equality in Equation (6) shows that the compensating matrices $C_L$ and $C_R$ are inverses of the distortion matrices $D_L$ and $D_R$, respectively.

Once calculated, the compensating matrices may be applied to the distorted EM field matrix (see, e.g., the first equality in Equation (6)) to determine the undistorted EM field matrix from a measured, distorted EM field matrix.

The compensating matrices $C_L$ and $C_R$ are a pair of 3×3 matrices, each including up to nine free parameters, and therefore the pair includes up to 18 free parameters, which have to be determined. The parameters may be found using numerical methods through optimization (e.g., linear or quadratic programming, gradient descent, constrained optimization techniques, etc.). Although there are up to 18 free parameters in this formulation, there is possibility that less than 18 may be needed. For example, if one of the compensating matrices is found to be a rotation matrix, then that matrix has only three free parameters (e.g., three rotation angles) rather than nine free parameters.

In some implementations, by collecting EM sensor data at numerous positions and orientations, the EM distortion compensating matrices $C_L$ and $C_R$ may be determined. Ground truth values for the position and orientation of the EM sensor 604 can also be collected. Determining the compensating matrices in this manner may be feasible during manufacturing of the EM tracking system in a factory or during usage where the ground truth positions and orientation of the sensor may be found with other techniques, for example, using a camera or other sensors. Further, this method for determining the compensating matrices may be limited to situations where the EM field in the environment does not change appreciably from the EM field experienced during calculation of the compensating matrices.

In actual use in an AR or VR environment, the ambient EM field often changes in real time, for example, as the user moves their body position, moves around a room, or moves from room to room. In such an AR or VR environment, there may be a number of methods that may be used to provide ground truth position and orientation of the EM sensor 604 for calculation of the compensating matrices. For example, the AR/VR system can utilize ultrasound, infrared (IR) light emitting diodes (LEDs), or an outward-facing world camera (e.g., the camera 124) that can image the position and orientation of a user input device (e.g., the hand-held controller 606) in the environment (see, e.g., FIG. 8). The user input device can include optically-recognizable fiducial markers (e.g., Aruco markers) or IR LEDs to assist in determining the pose of the user input device or the distance between the outward-facing world camera and the user input device. When the user input device is not in the field of view (FOV) of the outward-facing world camera, the user may use feedback from the scene to operate the user input device, and there may be a larger tolerance in knowing the exact pose of the user input device, since the user may be relying somewhat more on the feedback of the scene to operate the user input device than a precise pose of the user input device. Thus, EM distortion correction may, in some cases, only be needed when the user input device is in the field of view (FOV) of the outward-facing camera, where higher accuracy is desired. The ground truth pose of the user input device may be obtained from analysis of images from the outward-facing world camera.

In some embodiments, the compensating matrices may be determined using matrix techniques (e.g., singular value decomposition) in real time without the need for obtaining ground truth pose information (e.g., without using image data collected from an outward-facing world camera). Various implementations of such matrix analysis techniques are described below with reference to Equation (12).

Higher Order Mapping

The positions and orientations from the method described above usually have to be transformed to a different frame of reference, because of the placement of the EM sensor coils with respect to a frame of reference of a wearable component 58. This frame (or frame of reference) is sometimes called a world frame (or world frame of reference). In some implementations, it is convenient to combine the transformation to the world frame with higher order transformations that may be used to correct for EM distortions from the nearby environment. The coordinates derived from the rotation matrix P (which represents the position of the EM sensor with respect to the EM emitter; see, for example, Equation (4)) can further be mapped to coordinates of the world frame using, for example, higher order polynomials (e.g., of degree two or greater) or spherical harmonics. Therefore, $$X = H_x(x,y,z),$$
$$Y = H_y(x,y,z),$$
$$Z = H_z(x,y,z), \quad (7)$$

where X, Y, and Z are the sensor's coordinates in the world frame, x, y, and z are the coordinates derived from the matrix P, and the functions $H_x$, $H_y$, and $H_z$ represent the spherical harmonics or polynomials used to perform the mapping. With known functions $H_x$, $H_y$, and $H_z$, the mapping from x, y, and z to X, Y, and Z may be directly computed.

Performance of this mapping scheme may utilize the ground truth position and orientation the EM sensor with respect to the EM emitter that is collected together with corresponding EM data at several (e.g., N) positions and orientations. Because there are 6DOF, one may tend to think that $N^6$ sets of data need to be collected, which might be impractical. However, this is not the case. N sets of data may be collected to perform the mapping, such that at each of the N positions, a different orientation of the EM sensor with respect to the EM emitter is assigned. Thus, the mapping scheme may be performed quickly and efficiently.

In practice, it has been found that the above-described distortion correction and mapping scheme may be performed very quickly, in that only a few iterations are needed to obtain a convergent solution for $C_L$ and $C_R$. Because of the speed of convergence, this algorithm may be used in real-time distortion remapping, which is advantageous for handling ambient EM distortions, where the distortion field usually changes in real-time due to movement, for example, head, hand, or hand-held controller movement or the user changing his or her environment such as moving from one room to another.

In embodiments where the distortion mapping scheme is combined with the direct solution method for finding the 6DOF pose described below, a very robust, efficient, and computationally fast EM distortion mapping scheme may be achieved in real-time.

Direct Closed-Form Solution for 6DOF Pose

An example of a direct closed form method of solving for the 6DOF pose without using numerical methods is described here. This method has the potential of reducing or avoiding problems that may be encountered using numerical methods. For example, with certain numerical methods there is a potential risk of terminating the numerical method at a local minimum, instead of at the intended solution, especially when noise and EM distortion are present in the EM localization data. Also, because the magnitude of the magnetic field may be the same at different locations, such as at positions of symmetry, use of numerical methods risks providing results on the other side of the octant or coordinates with incorrect signs. This may be especially true when finding positions of an EM sensor that is not in motion. The direct closed-form method also may provide a significant improvement in computational speed in comparison to various numerical methods.

The direct method for 6DOF pose determination takes advantage of the fact that the field matrix equation (Equation (3), reproduced below) is a function of an SO(3) rotation matrix (where SO(3) is the 3D rotation group) and a diagonal matrix:

$$F = \frac{c}{r^3} T\, P^{-1}\, KPE. \tag{3}$$

Thus, if singular value decomposition (SVD) is used to decompose the field matrix F, it is expected that three matrices including a diagonal matrix S in between two rotation matrices U and V are obtained:

$$F = USV^T. \tag{8}$$

The diagonal matrix S is expected to have diagonal elements with the values of the constants from c, r and E absorbed into them. In the case where the three source coils have the same strength, the matrix E becomes a constant multiplied by a 3×3 unit matrix. Since the matrix K is diagonal with elements $[k, -k/2, -k/2]$, it is expected that the diagonal elements of S would be such that the second element and the third element would be approximately of equal magnitude and the first element would have a magnitude that is twice that of the second element and twice that of the third element (and opposite sign).

The rotation matrix V is related to the rotation matrix P. When the first column of the matrix P is multiplied by the distance r between the EM sensor and the EM emitter, the coordinates x, y, and z of the EM sensor with respect to the EM emitter are obtained. As described above, these coordinates may be transformed to the AR device's world frame using Equation (7).

Since P is a product of azimuth and pitch rotation matrices (see, for example, Equation (4)), it may be shown regardless of having an additional roll term added, the first column of the resulting matrix will not change. Thus, regardless of additional roll on the V matrix, the first column of V will contain information proportional to the relative position of the EM sensor with respect to the EM emitter.

Taking E to be a unit matrix, the rotation matrix T representing the 3DOF rotation of the EM sensor with respect to the EM emitter may be found to be:

$$T = \frac{r^3}{c} F\, P^T\, K_v P, \tag{9}$$

where now $K_v$ is the inverse of K, with diagonal elements $(1/k)*[1, -2, -2]$, and P is a 3×3 rotation matrix computed based on the position of the EM sensor with respect to the EM emitter in terms of azimuth θ and pitch φ, represented by $$P = rotz(\theta)\square roty(\varphi) \tag{10}$$

The 3×3 matrix T provides the 3DOF orientation of the EM sensor with respect to the EM emitter and may be calculated from Equation (9).

This method provides the pose in one of two hemispheres surrounding the EM sensor. For the other hemisphere, the pose may be obtained by changing the sign of the x, y, and z position values.

Note that Equations (8) and (9) utilize the undistorted EM field matrix F. In the presence of EM distortion, the undistorted EM field matrix F may be determined from the distorted EM field matrix $F_d$, for example, by using the distortion mapping techniques described herein (e.g., by using the compensating matrices $C_L$ and $C_R$).

With the above method, the 6DOF pose (e.g., position and orientation) of the EM sensor may be calculated directly from the above-described matrices without using iterative numerical methods. The 6DOF pose may be determined even in the presence of EM distortion caused by ferromagnetic and electrically conductive materials in the environment of the EM tracking system. As noted above, this direct method can provide a significant improvement in computation time, as well as reducing or avoiding various problems seen with iterative numerical methods.

Although the distortion mapping and correction techniques may be used together with the direct closed form 6DOF pose determination techniques, this is not a requirement. Various embodiments of EM tracking systems can implement either technique separately or can implement both techniques together.

Example Experimental Validation of the EM Distortion Mapping and Direct 6DOF Pose Techniques In brief, to remove or reduce EM distortion, the pair of compensating matrices $C_L$ and $C_R$ were determined from the collected data so that the undistorted EM field matrix F could be computed from the measured, distorted EM field matrix via: $F = C_L F_d C_R$. After recovering the undistorted EM field matrix F, the position and orientation of the EM sensor was computed using the direct, closed form 6DOF pose computation technique. As described above, the direct, closed-form solution decomposes the field matrix using SVD into a diagonal matrix and two rotation matrices. The position and orientation of the EM sensor are determined from the two rotation matrices.

Validation of the combination of the EM distortion correction technique together with the direct 6DOF pose computation was performed using actual data collected from experiments with an embodiment of an EM tracking system. Example results showed significant reduction in the distortions from an original amount of EM distortion to a level of 95th percentile errors below 5 mm (for position) and 5 degrees (for orientation). This represents a substantial error reduction, for example, by a factor of about 5 to 10.

Real Time EM Distortion Correction Using Matrix Techniques

As discussed above, in an AR or VR context, the ambient EM distortions change as the user, for example, changes their pose, moves the user input device around, moves around a room, or moves from room to room, because the distance and orientation of the EM sensor and EM emitter from conducting or ferromagnetic materials in the environment will change. Thus, the ambient EM distortion will change in real time. As will be described below, a technique has been developed that provides real-time correction of ambient EM distortion without the need for obtaining ground truth information (e.g., relative distances or poses of the EM sensor and EM emitter). This technique uses the eigenvalues of the EM field matrix, which may be extracted using SVD, to correct a distorted EM field matrix measured by the EM sensor.

The EM field matrix F may be written according to Equation (3) (described above and reproduced below) as $$F = \frac{c}{r^3} T \, P^{-1} \, KPE, \tag{3}$$

where K is a 3×3 diagonal matrix with diagonal elements [k, −k/2, −k/2], where k is the magnitude of the largest eigenvalue. As described above with reference to Equation (8) (reproduced below), the EM field matrix F may be decomposed via SVD into a diagonal matrix S in between two rotation matrices U and V:

$$F = USV^T. \tag{8}$$

The diagonal elements of S are also the eigenvalues of the EM field matrix F.

When the EM field is undistorted, it is expected that the eigenvalues of F have magnitudes of about [k, k/2, k/2], where k is the magnitude of the largest eigenvalue. When the EM field is distorted, the eigenvalues of F are expected to have magnitudes that deviate from [k, k/2, k/2]. Information from this deviation may be used to calculate a distortion metric (DM) that gauges how much the EM field is distorted. A distortion metric (DM) above a threshold level over a period of time may be used to trigger distortion correction. An example of a distortion metric (DM) and associated threshold(s) are described below with reference to FIG. 15.

Applicant has identified an invariant property of the EM field matrix F. The determinant of the EM field matrix remains substantially invariant (e.g., unchanged) even when the ambient EM field is inducing distortions. Thus, $$\det(F) \approx \det(F_d), \tag{11}$$

where 'det' represents the determinant of a matrix.

Figure 12:
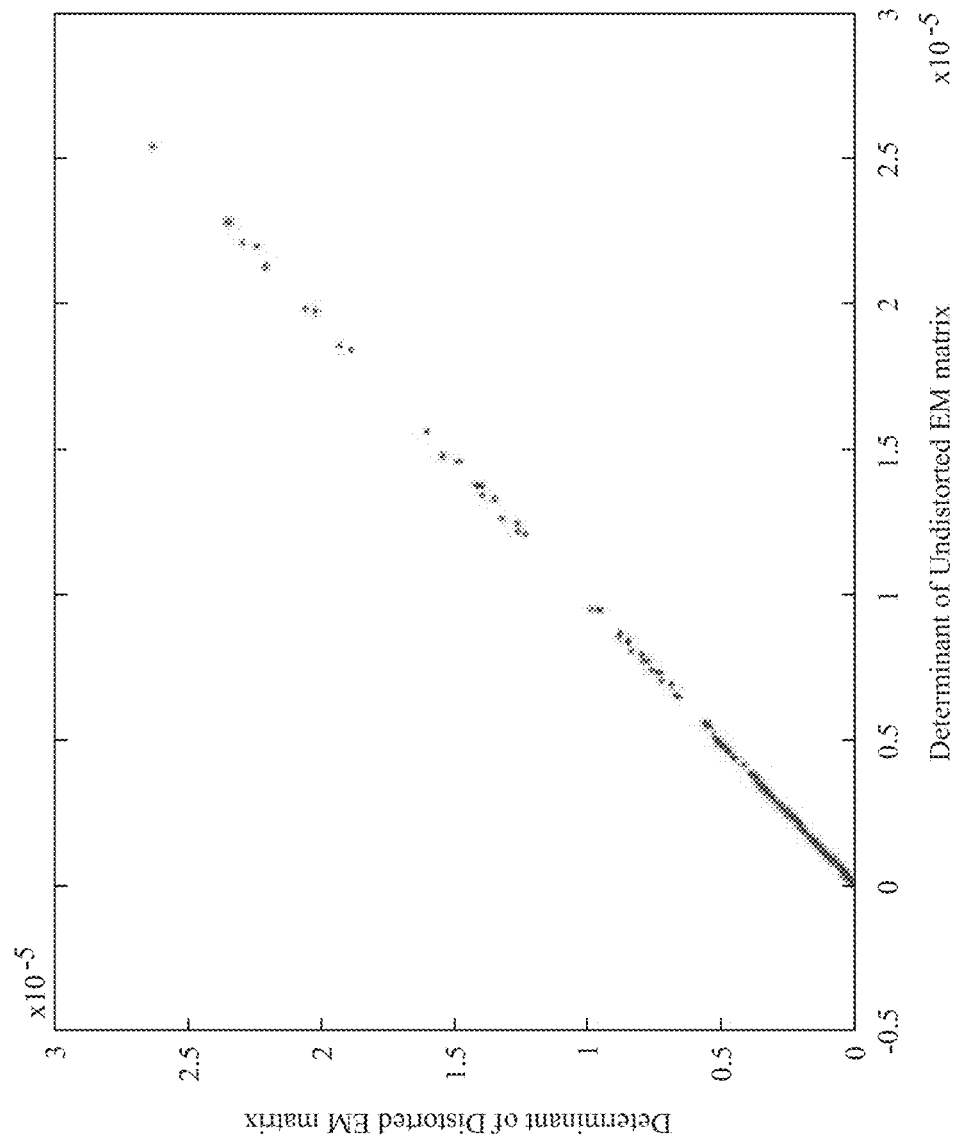
FIG. 12 is a graph showing an example of an invariant property of the EM field matrix. The determinant of the undistorted EM field matrix is plotted on the horizontal axis, and the determinant of the distorted EM field matrix is plotted on the vertical axis, for a range of different EM field distortions. This graph shows that the determinant of the EM field matrix is substantially invariant to the presence of EM distortion.

FIG. 12 is a graph showing an example of this invariant property. In FIG. 12, the determinant of the undistorted EM field matrix det(F) is plotted on the horizontal axis, and the determinant of the distorted EM field matrix det($F_d$) is plotted on the vertical axis, for a range of different EM field distortions. As may be seen from FIG. 12, there is a highly linear relationship with a slope of one (unity) between det(F) and det($F_d$) which provides strong experimental validation for Equation (11).

Using Equation (6) as described above, applicant has developed a method to determine the undistorted EM field matrix F and the compensating matrices from a series of successive distorted EM field matrices $F_d$ collected, e.g., in real time via: $F = C_L \, F_d \, C_R$, where $C_L$ and $C_R$ are the compensating matrices. The invariant determinant property from Equation (11) and the expectation that the eigenvalues of the undistorted EM field matrix F have magnitudes of about [k, k/2, k/2] provide a method for calculating the compensating matrices using numerical optimization methodology that includes the following constraints:

$$\det(C_L) = 1,$$

$$\det(C_R) = 1, \tag{12}$$

Eigenvalues of F have magnitudes k, k/2, k/2.

In some embodiments, constraints include k being close to unity, and the eigenvalues being close to [1, ½, ½]. The degree of being close can depend on, for example, the amount of pose error that is acceptable for operation of the wearable display device. For example, for a smaller acceptable amount of pose error, the eigenvalues will be closer to [1, ½, ½]. In various embodiments, being close includes being within 5%, 1%, 0.1%, 0.01%, or some other tolerance or [1, ½, ½].

Implementations for determining the compensating matrices using Equation (12) may have several advantages. For example, ground truth data for the EM sensor or EM emitter pose or relative distance is not needed (e.g., data from a world camera or other sensor is not needed). Further, the eigenvalues of the distorted EM field matrix provide a metric to detect the presence of EM distortion or changes to ambient EM distortion. Also, the determination of the compensating matrices may be performed computationally efficiently and quickly in order to correct for ambient EM distortions in real time, which may be advantageous for AR or VR applications.

After recovering the undistorted EM field matrix F from the distorted EM field matrix $F_d$ measured by the EM sensor, using the compensating matrices $C_L$ and $C_R$ (e.g., calculated via the constraints in Equation (12)), the position and orientation of the EM sensor may be computed using the direct, closed form 6DOF pose computation technique described above.

Although the foregoing techniques have been described, and may be implemented without the use of world cameras or other sensors to provide ground truth data regarding EM sensor and emitter pose or relative distance, in some embodiments, world camera or other sensor data could be used to supplement the techniques described above.

Example EM Tracking System with Real-Time EM Distortion Correction

Figure 13:
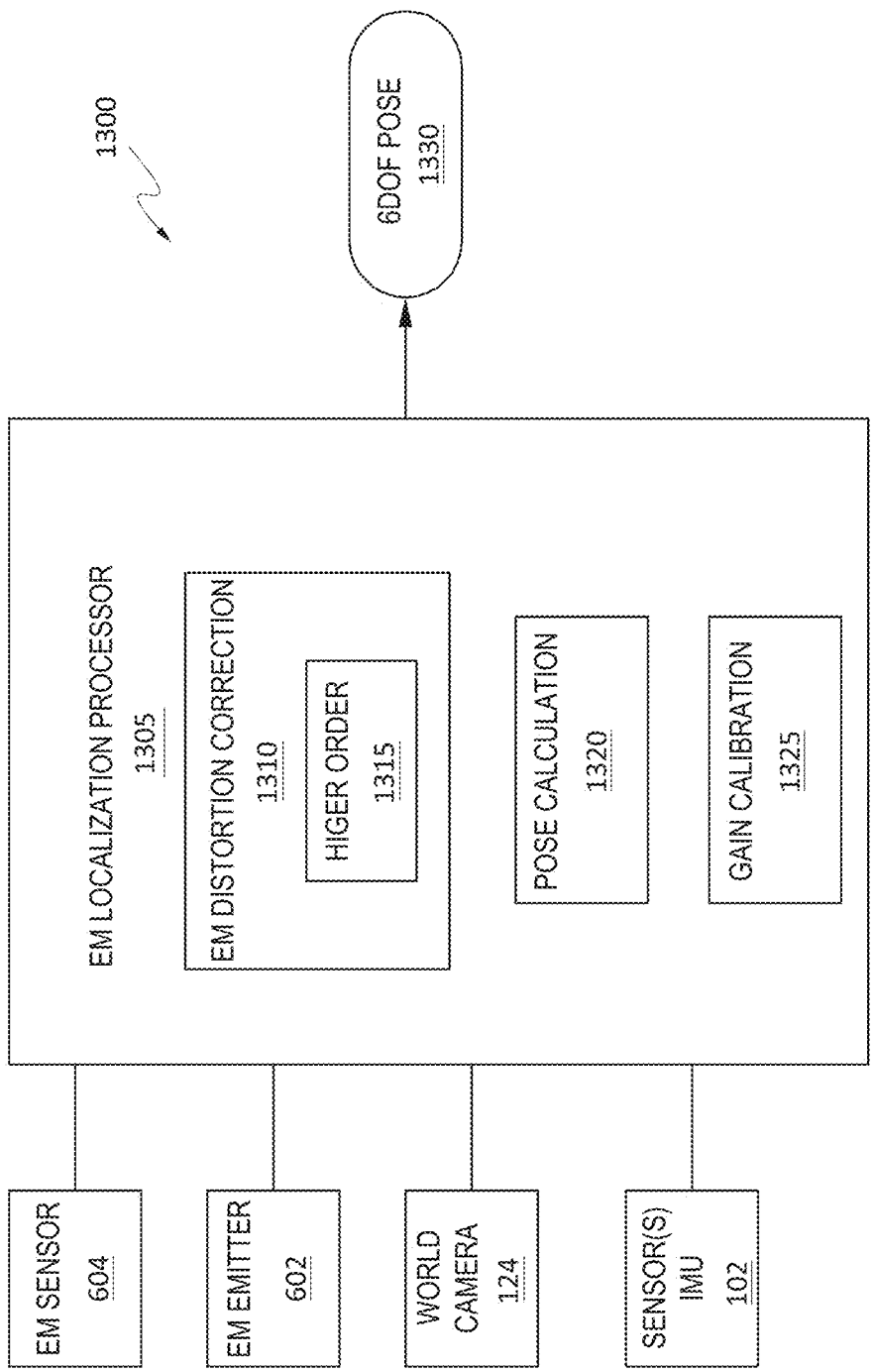
FIG. 13 is a block diagram illustrating an example of an EM tracking system that can correct for ambient EM distortions in real time.

FIG. 13 is a block diagram of an example of an EM tracking system 1300 that can correct for ambient EM distortions in real time. Embodiments of the EM tracking system 1300 are compatible with and may be used in the example EM tracking systems described with reference to FIGS. 4 and 6 and in the wearable display systems described with reference to FIGS. 2A-2D, 3, 8, and 9A-9B.

The EM tracking system 1300 includes an EM sensor 604, an EM emitter 602, and an EM localization processor 1305. Both the EM sensor 604 and the EM emitter 602 may each include three orthogonal coils as described above. The EM localization processor 1305 may be implemented via any of the processors in an AR or VR system such as, for example, the local processing and data module 70 or the processors 128 described with reference to FIG. 6. In some embodiments, the EM localization processor 1305 may receive and process input from an outward-facing world camera (e.g., the outward-facing world camera 124) and/or other sensors (e.g., an IMU 102), for example, to provide ground truth estimates for EM sensor pose or relative distance between the EM sensor 604 and EM emitter 602 (e.g., used for calculating the EM distortion compensating matrices). The EM localization processor 1305 may, in some embodiments, include the control logic for driving the EM emitter 602 to generate a magnetic field, for example, via AC or DC currents to the coils of the EM emitter 602.

The EM localization processor 1305 may be programmed to perform the EM distortion correction 1310, in which a distorted EM field matrix $F_d$ is corrected for ambient EM distortion via application of EM distortion compensating matrices $C_L$ and $C_R$. The compensating matrices may be calculated by a method that includes the invariant technique described with reference to Equation (12). In some embodiments, the EM localization processor 1305 may determine a higher order mapping 1315 of sensor pose to a world frame of an AR or VR system, for example, by using, for example, spherical harmonics or polynomial equations as set forth in Equation (7).

The EM localization processor 1305 can determine the pose of the EM sensor 604 at pose calculation block 1320. In some embodiments, the pose calculation may be a 6DOF pose (e.g., position and orientation). In some embodiments, the pose calculation may be a 3DOF pose (e.g., position or orientation). The pose calculation block 1320 receives the undistorted EM field matrix F calculated by the EM distortion correction block 1310 and generates a pose 1330. For example, the 6DOF pose may be rapidly and efficiently calculated using the direct, closed-form solution described above with reference to Equations (8) to (10).

The EM sensor 604 typically measures voltages in three orthogonal sensing coils. To convert measured voltages into distance between the EM sensor 604 and the EM emitter 602, a gain calibration 1325 may be applied to the measured voltages. Generally, there is a different gain for each of the three coils, for example, a gain $G_x$ for the x-coil, a gain $G_y$ for the y-coil, and a gain $G_z$ for the z-coil. The gains may be calculated during a manufacturing stage and stored by the EM tracking system 1300 (e.g., in non-volatile, non-transitory storage). In some embodiments, the gains may be calculated in the field, where the outward-facing world camera 124 is used to image the EM emitter 602 (e.g., disposed within a hand held controller 606), and computer vision techniques are used to calculate the distance.

The EM distortion correction block 1310 and the pose calculation block 1320 may be performed independently of each other. For example, in AR or VR applications where real-time pose is desired, the pose calculation block 1320 may be executed in real time. The parameters and matrices for the correction of EM distortion by the EM distortion correction 1310 block may, but need not, be performed in real time. For example, as described herein, the eigenvalues of the measured EM field matrix provide a metric for whether there is a distortion in the ambient EM environment. An example of a distortion metric (DM) and associated threshold(s) are described below with reference to FIG. 15. Higher values of the distortion metric (DM) may indicate the presence of more metallic materials in the environment that may contribute to distortions in EM field. Lower values of the distortion metric (DM) may indicate the presence of fewer metallic materials in the environment. If the distortion metric (DM) exceeds a threshold, the EM distortion correction block 1310 may be executed to calculate the distortion compensating matrices in order to remove distortion from the measured EM field matrix. A change in the metric is indicative of a change in the ambient EM environment, and the EM distortion correction block 1310 may be re-executed to re-calculate the distortion compensating matrices to reflect the changed ambient EM environment. In some embodiments, the EM distortion correction block 1310 may be executed periodically or at preset intervals (e.g., every 30 s, every minute, every 2 minutes, etc.), or from time to time (e.g., when the ambient EM field changes sufficiently). For example, the EM distortion correction block 1310 may collect the EM field matrix measurements over a period of time (e.g., 200 to 300 points over a period of 2 minutes), and calculate new values for the compensating matrices at the end of the time period or when a change (e.g., above a threshold) in the EM field matrix occurs.

For a wearable AR or VR device, a head mounted component (e.g., the head mounted component 58) can include the EM sensors 604 shown in FIG. 9A or the coils 148, 150, 152 shown in FIG. 9B, and these EM sensors 604 can provide the 6DOF head pose of the wearer, when processed by the EM localization processor 1305. The EM sensors 604 can additionally or alternatively be disposed in a belt pack (e.g., the belt pack 70) (see, e.g., FIG. 6) for determining body pose of the wearer. The EM emitter 602 may be disposed in a hand held controller (e.g., the hand held controller 606). In some embodiments, the EM emitter 602 may be disposed on the head mounted component (e.g., the head mounted component 58), and the EM sensors 604 may be disposed on a hand held controller (e.g., the hand held controller 606) or a belt pack (e.g., the belt pack 70).

Example Method for EM Distortion Correction in an EM Tracking System

Figure 14:
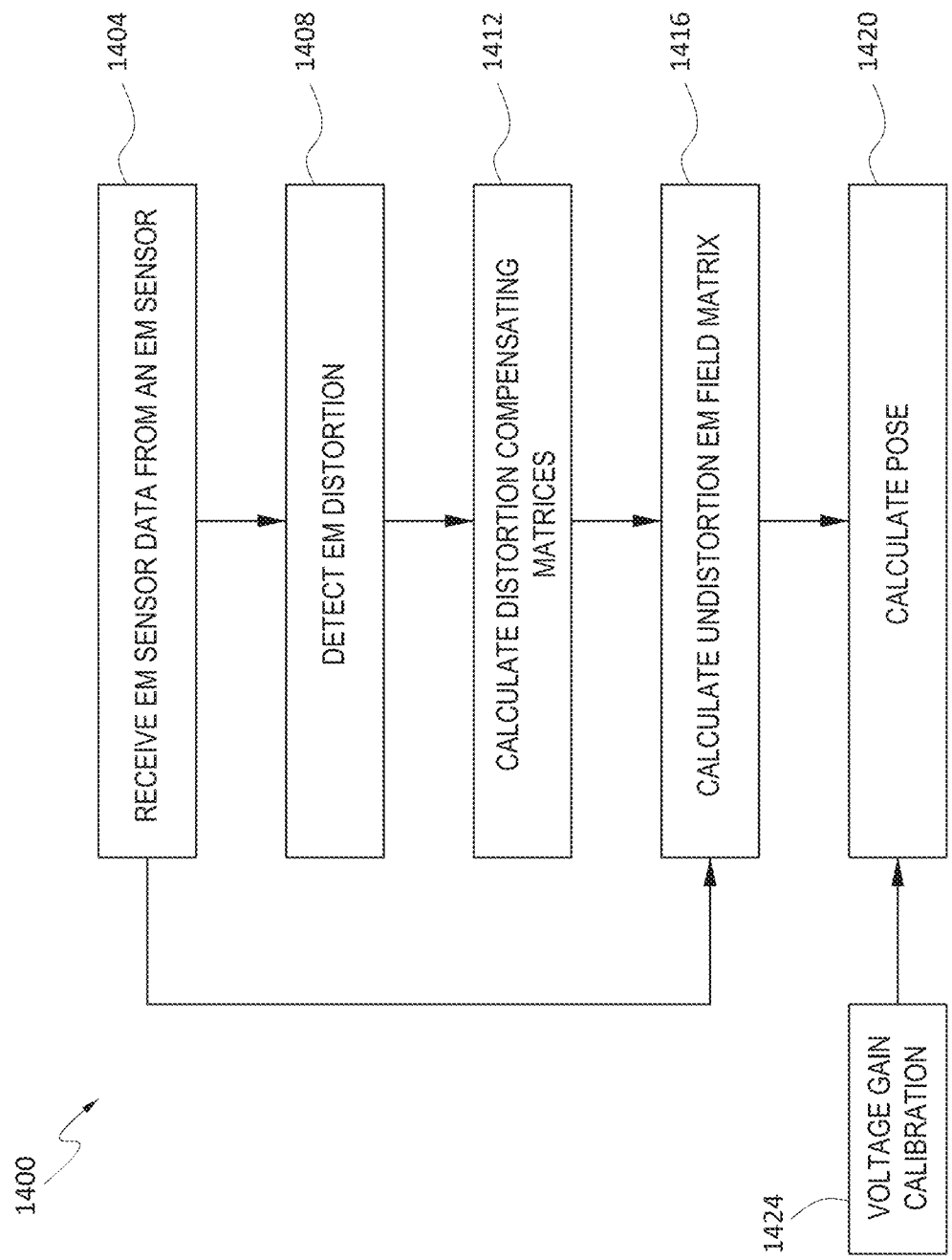
FIG. 14 is a flowchart illustrating an example method for correcting for EM distortion in an EM tracking system.

FIG. 14 is a flowchart illustrating an example method 1400 for correcting for EM distortion in an EM tracking system, according to some embodiments. Embodiments of the method 1400 may be performed by the EM tracking system 1300 described with reference to FIG. 13 (e.g., by the EM localization processor 1305). Embodiments of the method 1400 may also be performed by the example EM tracking systems described with reference to FIGS. 4 and 6 and by the wearable display systems described with reference to FIGS. 2A-2D, 3, 8, and 9A-9B (e.g., by the local processing and data module 70 or the processors 128).

At block 1404, the method 1400 receives EM sensor data from an EM sensor (e.g., any of the EM sensors 604). The EM sensor data may include an EM field matrix indicative of the response of the EM sensor to a magnetic field generated by an EM emitter (e.g., the EM emitter 602). As described above, the measured EM field may be distorted by the presence of ferromagnetic or electrically conductive materials near the EM tracking system.

At block 1408, the method 1400 detect whether EM distortion is likely present in the measured EM sensor data. As described above, when the EM field is undistorted, it is expected that the eigenvalues of EM field matrix have magnitudes of about [k, k/2, k/2], where k is the magnitude of the largest eigenvalue. When the EM field is distorted, the eigenvalues of the EM field matrix are expected to have magnitudes that deviate from [k, k/2, k/2]. Thus, the method 1400 can measure this deviation and use the deviation as a metric that measures how much the EM field is distorted.

For example, if the magnitude of the deviation from the undistorted eigenvalues [k, k/2, k/2] exceeds a threshold (e.g., either for individual eigenvalue deviations, a sum of squares of the eigenvalue deviations, or deviations from a product of the eigenvalues (which is the determinant of the EM field matrix)), then EM distortion has been detected. If the magnitude of the deviation from the undistorted eigenvalues [k, k/2, k/2] is less than the threshold, then EM distortion is not present or is present at sufficiently low levels that pose estimation is substantially unaffected by the EM distortion. The magnitude of the deviation from the undistorted eigenvalues may be based at least partly on the distortion metric (DM) described below with reference to FIG. 15. The method 1400 may also track the value of the deviation over time to determine whether the EM distortion has changed appreciably.

At block 1408, the method 1400 may monitor whether the change in the eigenvalue deviation (or the distortion metric (DM) described with reference to FIG. 15) exceeds another threshold to determine that the EM distortion has changed. For example, if the EM distortion has not changed appreciably (e.g., the change in the eigenvalue deviation is below the threshold, such as 1%, 5%, 10%, etc.), then the method 1400 may not need to re-calculate the distortion compensating matrices (described below for block 1412). Alternatively, if the EM distortion has changed appreciably (e.g., the change in the eigenvalue deviation is above the threshold or the change in distortion metric (DM) is above the threshold), then block 1408 may trigger the method 1400 to re-calculate the distortion compensating matrices at block 1412. In some embodiments, the block 1408 may be optional and may not be performed, and the distortion compensating matrices may be continually updated. This may be beneficial where the processing power is sufficiently high that continual update is not too large a computational burden on the EM tracking system.

At block 1412, the method 1400 calculates the distortion compensating matrices $C_L$ and $C_R$. For example, the method 1400 can utilize the technique described with reference to Equation (12) to calculate the pair of compensating matrices. In various implementations, the distortion compensating matrices may be re-calculated at block 1412 when the EM distortion changes appreciably, from time to time (e.g., every 10 min, 20 min, etc.), or continuously (e.g., in real time). In such cases, metal distortion procedures triggered as described above may be optional.

At block 1416, the method 1400 calculates the undistorted EM field matrix (F) from the measured EM field matrix ($F_d$, received at block 1404) using the distortion compensating matrices calculated at block 1412. As described with reference to Equation (6), the undistorted EM field matrix may be calculated as $F = C_L F_d C_R$.

At block 1420, the method 1400 calculates the pose of the EM sensor from the undistorted EM field matrix. The pose may be a 6DOF pose (e.g., position and orientation). Block 1420 may utilize the direct, close-form solution for the 6DOF pose described with reference to Equations (8) to (10). For example, the singular value decomposition (SVD) of the undistorted EM field matrix provides the 3DOF relative position of the EM sensor with respect to the EM emitter (e.g., from the first column of the matrix V computed in the SVD). The 3DOF orientation of the EM sensor with respect to the EM emitter may be found from the matrix T calculated from Equation (9). The calculated pose can include the higher order mapping described with reference to Equation (7), in which the spatial coordinates of the pose are mapped to the world frame of the AR or VR device.

To convert voltages measured by the EM sensor into distance r between the EM sensor and the EM emitter, at block 1424 a gain calibration may be applied to the measured voltages (e.g., described with reference to block 1325 of FIG. 13). The gain calibration may be a factory calibration that is stored by the EM tracking system or an in-field calibration where image analysis of images obtained by an outward-facing camera of the AR/VR device is used for ground truth estimates of the relative EM sensor-EM emitter distance.

The method 1400 may be performed in real time, which may be advantageous in an AR or VR environment where EM distortion is likely to change in real time. However, as described with reference to the EM tracking system 1300 in FIG. 13, not all the blocks of FIG. 14 need be executed in real time. For example, pose may be needed in real time for an AR or VR system, and the blocks 1404, 1416, and 1420 may be executed in real time, while the blocks 1408 and 1412 (for calculating the compensating matrices) may be executed less frequently, for example, when the EM distortion changes appreciably or periodically. Thus, embodiments of the method 1400 may be efficiently performed and can by dynamically tailored to provide accurate pose estimations, because the recalculation of the distortion compensating matrices is performed only when needed (or from time to time).

Metric for Metal Distortion

As described above, when the EM field is undistorted, it is expected that the eigenvalues of the EM field matrix F have magnitudes of about [k, k/2, k/2], where k is the magnitude of the largest eigenvalue. When the EM field is distorted, the eigenvalues of F are expected to have magnitudes that deviate from [k, k/2, k/2]. Information from this deviation may be used to calculate a distortion metric (DM) that gauges how much the EM field is distorted. In some embodiments, the distortion metric (DM) may increase as the presence of metallic materials in the environment increase. A distortion metric (DM) above a threshold level at a point in time or over a period of time may be used to trigger distortion correction procedures (see, e.g., the EM distortion correction 1310 by the EM localization processor 1305 described with reference to FIG. 13, or EM distortion correction at blocks 1412 and 1416 of the method 1400 described with reference to FIG. 14).

As described above with reference to Equation (8) (which is reproduced below), the EM field matrix F may be decomposed via SVD into a diagonal matrix S in between two rotation matrices U and V:

$$F = USV^T. \tag{8}$$

The diagonal elements of S are also the eigenvalues of the EM field matrix F.

The distortion metric (DM) can be calculated from the following procedure. Let the diagonal elements of the matrix S be denoted by [E1, E2, E3]. The diagonal elements may be normalized by a factor f that is equal to the cube root of the determinant of the matrix S. The normalized diagonal elements are denoted by [e1, e2, e3] and are given by:

$$[e1, e2, e3] = [E1, E2, E3]/f, \tag{13}$$

where $f = \det(S)^{1/3}$.

After normalization to obtain e1, e2, and e3, the distortion metric (DM) can be found from the following formula:

$$DM = \text{norm}([M-e1, M-e2, M-e3]), \tag{14}$$

where norm([x,y,z]) is a normalization function and M is a constant equal to $4^{1/3}$, in this embodiment. The constant M may be based on the value of the determinant of the EM field matrix or the matrix S in a metal free environment. The normalization function can be any suitable function that maps a triplet of numbers to a scalar value. The normalization function can be selected to be positive definite (so that the distortion metric (DM) is also positive definite). In some embodiments, the normalization function is norm([x,y,z]) =sqrt($x^2+y^2+z^2$), where sqrt is the square root function.

Without metal distortion, the distortion metric (DM) is expected to be equal to 0. The distortion metric (DM) tends to increase as the amount of metal distortion increases. In environments that are substantially free from metals, apart from metals on the hand held controller 606 or the AR headset 58, the distortion metric DM tends to be in a range from about 0 to about 0.02.

Figure 15:
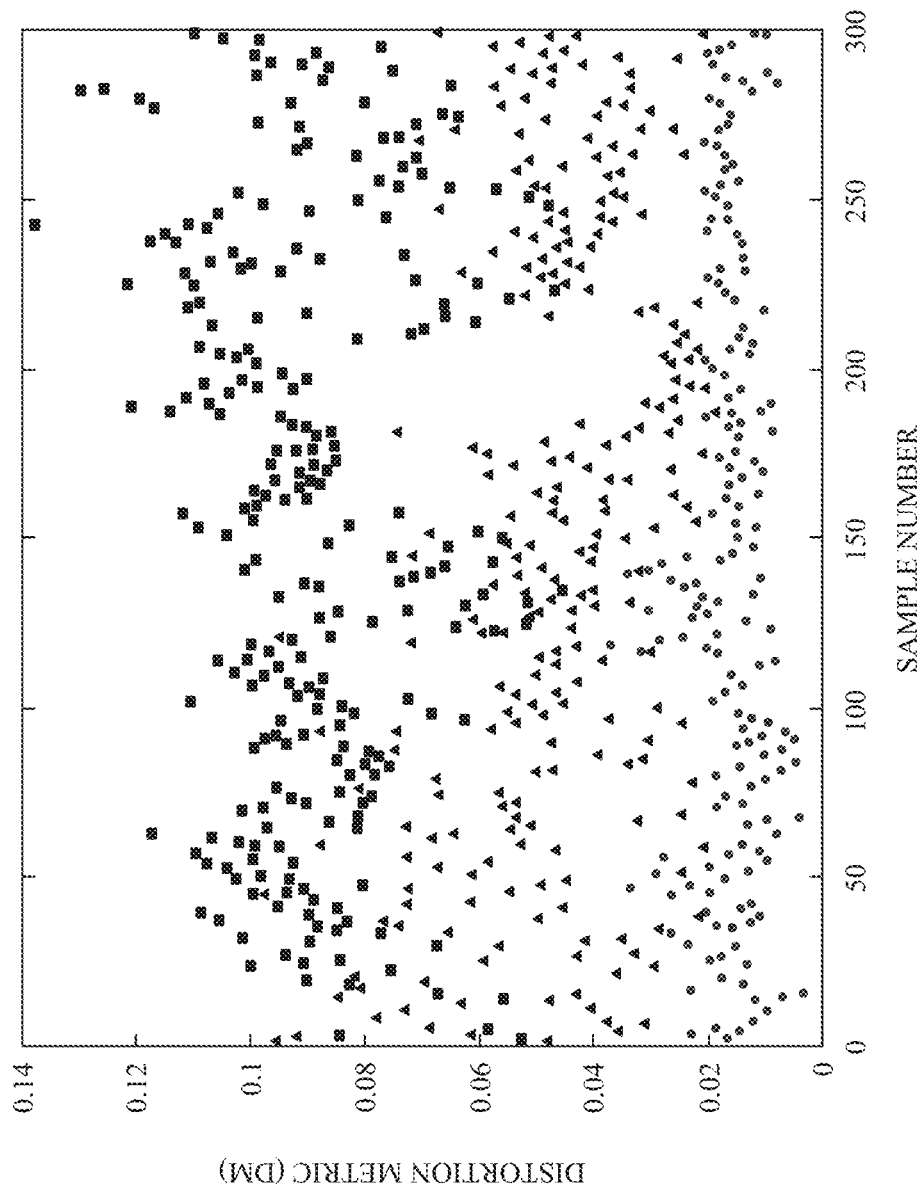
FIG. 15 is a graph that presents examples of experimental measurements of a distortion metric (DM) in three environments having different amounts of metal distortion: a low metal environment (solid circles), a medium metal environment (solid triangles), and a high metal environment (solid squares).

FIG. 15 is a graph that presents examples of experimental measurements of the distortion metric (DM) in three environments having different amounts of metal distortion: a low metal environment (solid circles), a medium metal environment (solid triangles), and a high metal environment (solid squares). The low metal environment refers to an environment where there are little or no metals except for metals on the hand held controller 606 or the AR headset 58, the medium metal environment has more environmental metals than the low metal environment, and the high metal environment has more environmental metals than the medium metal environment. In these experiments, 300 samples were taken in each of the environments and the distortion metric (DM) was computed for each of the samples.

As can be seen FIG. 15, as the amount of metals in the environment increases from low, to medium, to high, the distortion metric (DM) value also tends to increase. In these experiments, for low metal environments, DM was in a range from about 0 to about 0.02; for medium metal environments, DM was in a range from about 0.02 to about 0.08; and for high metal environments, DM was in a range from about 0.08 to about 0.12. In some embodiments, an alternative unit of measurement may be used in which "m" (or milli) is appended after the distortion metric (DM) values to represent m=×$10^{-3}$.

The experimental results shown in FIG. 15 may be used to set one or more thresholds associated with whether there is sufficient metal distortion in the environment to warrant correction for metal distortion by, e.g., the EM distortion correction 1310 by the EM localization processor 1305 described with reference to FIG. 13, or EM distortion correction at blocks 1412 and 1416 of the method 1400 described with reference to FIG. 14. For example, if the distortion metric (DM) is below a first threshold indicative of little or no metal distortion, then the metal distortion correction procedures may not be implemented by the EM localization processor 1305. In some embodiments, the first threshold is 0.02. By not implementing metal distortion correction procedures in low metal environments, the AR system can conserve power and computing resources when the AR system is located in the low metal environments.

In some embodiments, if the distortion metric (DM) is above a second threshold, then metal distortion exists in the environment, and metal distortion procedures can be implemented by the EM localization processor. In some embodiments, the second threshold equals the first threshold, so that there is a single threshold. In such implementations, metal distortion procedures may be implemented when the distortion metric (DM) exceeds the threshold and not implemented when DM is below the threshold. For example, if the distortion metric (DM) is measured by the EM tracking system 1300 to be above the threshold, then the EM localization processor 1305 can perform metal distortion correction procedures (e.g., performing blocks 1412 and 1416 of the method 1400 described with reference to FIG. 14).

In some embodiments, the second threshold may be greater than the first threshold, for example, about 0.03. Metal distortion correction procedures may be implemented if the distortion metric (DM) exceeds the second threshold. If the distortion metric (DM) is measured to be between the first threshold and the second threshold (e.g., between 0.02 and 0.03 in some embodiments), then it may be beneficial to have some metal correction, for example, if the distortion metric (DM) is in this range for a period of time longer than a threshold time period. As an example, if the distortion metric (DM) is measured to be between the first and the second thresholds for a time that is longer than the threshold time period, then the EM localization processor 1305 may implement the metal distortion procedures (e.g., by performing blocks 1412 and 1416 of the method 1400 described with reference to FIG. 14). Having two different thresholds may be advantageous, because computational resources and power may be reduced since the metal correction procedures are implemented only when the distortion metric (DM) is above the second threshold or when the distortion metric (DM) is between the first and the second thresholds for longer than the threshold time period. In some embodiments, when the distortion metric (DM) is above a threshold for more than a predetermined period of time, the user may also be alerted of this, so the user may remove the possible sources of distortions in the environment or move to another area where there is less presence of distortion in the environment.

Additional Aspects

Aspect 1. An augmented reality display system comprising: a display configured to project virtual images to eyes of a wearer; a frame configured to mount the display in front of the eyes of the wearer; an electromagnetic (EM) emitter configured to generate a magnetic field; an EM sensor configured to sense the magnetic field and provide EM sensor data, wherein one of the EM emitter or the EM sensor is mechanically coupled to the frame and the other of the EM emitter or the EM sensor is mechanically coupled to a component of the augmented reality display system that is independently movable relative to the frame; a hardware processor programmed to: receive EM sensor data from the EM sensor, the EM sensor data comprising an EM field matrix; detect presence of EM distortion based at least partly on the EM field matrix; calculate distortion compensating matrices; calculate, based at least partly on the distortion compensating matrices, an undistorted EM field matrix; calculate, based at least partly on the undistorted EM field matrix, a pose of the EM sensor; and cause the display to project the virtual images based at least in part on the calculated pose.

Aspect 2. The augmented reality display system of Aspect 1, wherein the EM sensor and the EM emitter each comprise three mutually orthogonal coils.

Aspect 3. The augmented reality display system of Aspect 1 or Aspect 2, wherein the pose comprises a six degree of freedom pose having three spatial coordinates and three angular coordinates.

Aspect 4. The augmented reality display system of any one of Aspects 1 to 3, wherein to detect the presence of EM distortion, the hardware processor is programmed to calculate a deviation of eigenvalues of the EM field matrix from eigenvalues for an undistorted EM field matrix.

Aspect 5. The augmented reality display system of any one of Aspects 1 to 4, wherein to calculate the distortion compensating matrices, the hardware processor is programmed to apply constraints that the determinant of each of the distortion compensating matrices is close to unity and eigenvalues of the undistorted EM field matrix are proportional to [1, ½, ½].

Aspect 6. The augmented reality display system of Aspect 5, wherein the hardware processor is programmed to perform a singular value decomposition (SVD) to calculate the eigenvalues of the undistorted EM field matrix.

Aspect 7. The augmented reality display system of Aspect 5 or Aspect 6, wherein the constraints comprise the eigenvalues of the undistorted EM field matrix being close to [1, ½, ½].

Aspect 8. The augmented reality display system of any one of Aspects 1 to 7, wherein to calculate the pose of the EM sensor, the hardware processor is programmed to perform a singular value decomposition (SVD) of the undistorted EM field matrix.

Aspect 9. The augmented reality display system of Aspect 8, wherein the hardware processor is programmed to calculate a three degree of freedom position of the EM sensor with respect to the EM emitter from the SVD.

Aspect 10. The augmented reality display system of any one of Aspects 1 to 9, wherein the hardware processor is programmed to calculate a three degree of freedom orientation of the EM sensor with respect to the EM emitter based at least partly on the undistorted EM field matrix, a diagonal matrix, and a rotation matrix based on azimuth and pitch.

Aspect 11. The augmented reality display system of any one of Aspects 1 to 10, wherein to calculate the pose of the EM sensor, the hardware processor is programmed to calculate the pose in a world frame of the augmented reality display system.

Aspect 12. The augmented reality display system of Aspect 11, wherein to calculate the pose in the world frame, the hardware processor is programmed to apply spherical harmonics or higher order polynomials.

Aspect 13. The augmented reality display system of any one of Aspects 1 to 12, wherein the hardware processor is programmed to calculate the distortion compensating matrices only when the detected EM distortion is above a first threshold or a change in the detected EM distortion is above a second threshold.

Aspect 14. The augmented reality display system of any one of Aspects 1 to 13, wherein the component of the augmented reality display system comprises a user-input totem, the EM sensor is mechanically coupled to the frame, and the EM emitter is mechanically coupled to the user-input totem.

Aspect 15. The augmented reality display system of Aspect 14, further comprising an outward-facing camera mechanically coupled to the frame.

Aspect 16. The augmented reality display system of Aspect 15, wherein the hardware processor is further programmed to: analyze images obtained by the outward-facing camera; determine, based at least partly on the analyzed images, a pose of the user-input totem; and calculate the distortion compensating matrices based at least in part on the determined pose of the user-input totem.

Aspect 17. The augmented reality display system of any one of Aspects 14 to 16, wherein the user-input totem further comprises a light source or an optically-recognizable fiducial marker configured to assist determining pose of the user-input totem.

Aspect 18. The augmented reality display system of any one of Aspects 1 to 17, wherein the hardware processor is further programmed to calculate a degree of EM distortion in the ambient environment using a metric based on eigenvalues of the EM field matrix.

Aspect 19. The augmented reality display system of Aspect 18, wherein the metric is based on a combination of differences of the eigenvalues from a reference value.

Aspect 20. The augmented reality display system of Aspect 19, wherein the eigenvalues are normalized based on a determinant of the EM field matrix.

Aspect 21. A system comprising: an electromagnetic (EM) emitter configured to generate a magnetic field; an EM sensor configured to sense the magnetic field and provide EM sensor data; and a hardware processor programmed to: receive the EM sensor data from the EM sensor, the EM sensor data comprising an EM field matrix; calculate, based at least partly on the EM sensor data, distortion compensating matrices; calculate, based at least partly on the distortion compensating matrices, an undistorted EM field matrix; and calculate, based at least partly on the undistorted EM field matrix, a pose of the EM sensor.

Aspect 22. The system of Aspect 21, wherein the hardware processor is programmed to: detect presence of EM distortion; and calculate the distortion compensating matrices only when the detected EM distortion is above a first threshold or a change in the detected EM distortion is above a second threshold.

Aspect 23. The system of Aspect 21 or Aspect 22, wherein to calculate the distortion compensating matrices, the hardware processor is programmed to apply constraints that the determinant of each of the distortion compensating matrices is close to unity and eigenvalues of the undistorted EM field matrix are proportional to [1, ½, ½].

Aspect 24. The system of any one of Aspects 21 to 23, further comprising: an outward-facing imaging system; and a hand-held user input device; wherein the hardware processor is programmed to: analyze images obtained by the outward-facing imaging system; determine, based at least partly on the analyzed images, a pose of the user input device; and calculate the distortion compensating matrices based at least in part on the determined pose of the user input device.

Aspect 25. The system of any one of Aspects 21 to 24, wherein the distortion compensating matrices comprise a first matrix $C_L$ and a second matrix $C_R$, and to calculate the undistorted EM field matrix, the hardware processor is programmed to evaluate $C_L F_d C_R$ where $F_d$ is the EM field matrix.

Aspect 26. The system of any one of Aspects 21 to 25, wherein to calculate the pose of the EM sensor, the hardware processor is programmed to calculate a singular value decomposition (SVD) of the undistorted EM field matrix.

Aspect 27. The system of any one of Aspects 21 to 26, wherein to calculate the pose of the EM sensor, the hardware processor is programmed to use direct computational methods that do not utilize numerical iteration.

Aspect 28. The system of any one of Aspects 21 to 27, wherein the hardware processor is further programmed to render a virtual object based at least in part on the calculated pose.

Aspect 29. The system of any one of Aspects 21 to 28, wherein the hardware processor is further programmed to calculate a degree of EM distortion in the ambient environment using a metric based on eigenvalues of the EM field matrix.

Aspect 30. The system of Aspect 29, wherein the metric is based on a combination of differences of the eigenvalues from a reference value.

Aspect 31. The system of Aspect 30, wherein the eigenvalues are normalized based on a determinant of the EM field matrix.

Aspect 32. A method for correcting for electromagnetic (EM) distortion in an EM tracking system, the method comprising: under control of a hardware processor: receiving EM sensor data from an EM sensor, the EM sensor data comprising an EM field matrix; calculating, based at least partly on the EM sensor data, distortion compensating matrices; calculating, based at least partly on the distortion compensating matrices, an undistorted EM field matrix; and calculating, based at least partly on the undistorted EM field matrix, a pose of the EM sensor.

Aspect 33. The method of Aspect 32, wherein the pose comprises a six degree-of-freedom (6DOF) pose.

Aspect 34. The method of Aspect 32 or Aspect 33, further comprising detecting presence of an EM distortion.

Aspect 35. The method of Aspect 34, detecting presence of the EM distortion comprises calculating a deviation of eigenvalues of the EM field matrix from eigenvalues for an undistorted EM field matrix.

Aspect 36. The method of Aspect 35, wherein detecting the presence of the EM distortion comprises determining that the deviation of the eigenvalues exceeds a threshold.

Aspect 37. The method of any one of Aspects 32 to 36, wherein calculating the distortion compensating matrices is performed only when the EM distortion exceeds a first threshold or a change in the EM distortion exceeds a second threshold.

Aspect 38. The method of any one of Aspects 32 to 37, wherein calculating the pose comprises performing a singular value decomposition of the EM field matrix.

Aspect 39. The method of any one of Aspects 32 to 38, wherein calculating the distortion compensating matrices comprises comparing to ground truth data for a relative pose of the EM sensor to an EM emitter obtained by a non-EM tracking system.

Aspect 40. The method of Aspect 39, wherein the non-EM tracking system comprises an imaging system or an ultrasound system.

Aspect 41. The method of any one of Aspects 32 to 40, further comprising calculating a degree of EM distortion in the ambient environment using a metric based on eigenvalues of the EM field matrix.

Aspect 42. The method of Aspect 41, wherein the metric is based on a combination of differences of the eigenvalues from a reference value.

Aspect 43. The method of Aspect 42, wherein the eigenvalues are normalized based on a determinant of the EM field matrix.

Aspect 44. An electromagnetic (EM) tracking system comprising: an EM emitter configured to generate a magnetic field; an EM sensor configured to sense the magnetic field; and a hardware processor programmed to perform the method of any one of Aspects 32 to 43.

Aspect 45. A system comprising: an electromagnetic (EM) emitter configured to generate a magnetic field; an EM sensor configured to sense the magnetic field and provide EM sensor data; and a hardware processor programmed to: receive the EM sensor data from the EM sensor, the EM sensor data comprising an EM field matrix; calculate a distortion metric based at least in part on the EM field matrix, the distortion metric indicative of presence of EM distortion in an environment of the EM sensor; determine whether the distortion metric passes a threshold; in response to a determination that the distortion metric passes the threshold: calculate, based at least partly on the EM sensor data, distortion compensating matrices; calculate, based at least partly on the distortion compensating matrices, an undistorted EM field matrix; and calculate, based at least partly on the undistorted EM field matrix, a pose of the EM sensor.

Aspect 46. The system of Aspect 45, wherein the hardware processor is programmed to: in response to a determination that the distortion metric does not pass the threshold: calculate, based at least partly on the EM field matrix, a pose of the EM sensor.

Aspect 47. The system of Aspect 45 or Aspect 46, wherein the threshold comprises a first threshold and a second threshold greater than the first threshold, and wherein the hardware processor is programmed to: determine a time period during which the distortion metric passes the first threshold and does not pass the second threshold; determine whether the time period passes a threshold time period; in response to a determination that the time period passes the threshold time period: calculate, based at least partly on the EM sensor data, distortion compensating matrices; calculate, based at least partly on the distortion compensating matrices, an undistorted EM field matrix; and calculate, based at least partly on the undistorted EM field matrix, a pose of the EM sensor.

Aspect 48. The system of any one of Aspects 45 to 47, wherein the hardware processor is programmed to: detect presence of EM distortion based at least partly on the distortion metric; and calculate the distortion compensating matrices only when the detected EM distortion is above a first threshold or a change in the detected EM distortion is above a second threshold.

Aspect 49. The system of any one of Aspects 45 to 48, wherein to calculate the distortion metric, the hardware processor is programmed to: calculate a deviation of eigenvalues of the EM field matrix from eigenvalues for an undistorted EM field matrix.

Aspect 50. The system of any one of Aspects 45 to 49, wherein to calculate the distortion metric, the hardware processor is programmed to: perform a singular value decomposition (SVD) of the EM field matrix.

Aspect 51. The system of Aspect 50, wherein to calculate the distortion metric, the hardware processor is programmed to: calculate eigenvalues of the SVD of the EM field matrix.

Aspect 52. The system of Aspect 51, wherein to calculate the distortion metric, the hardware processor is programmed to: calculate a determinant of the EM field matrix or the SVD of the EM field matrix to provide a normalization factor; normalize the eigenvalues based on the normalization factor to provide normalized eigenvalues; and calculate the distortion metric based at least in part on the normalized eigenvalues.

Additional Considerations

Although certain embodiments of the EM field distortion correction technology are described in the context of real-time pose determination for components of a wearable display system (e.g., EM sensors for tracking head pose or body pose in an AR or VR context), this is for illustration and not limitation. Embodiments of the EM field distortion correction technology can be used in other applications and with other devices and in general can be applied to any EM tracking system. For example, the EM field distortion correction technology can be used to correct for field distortions that occur in a medical or surgical environment and thereby provide an improved position or orientation of medical instruments used during a medical or surgical procedure.

Each of the processes, methods, and algorithms described herein and/or depicted in the attached figures may be embodied in, and fully or partially automated by, code modules executed by one or more physical computing systems, hardware computer processors, application-specific circuitry, and/or electronic hardware configured to execute specific and particular computer instructions. For example, computing systems can include general purpose computers (e.g., servers) programmed with specific computer instructions or special purpose computers, special purpose circuitry, and so forth. A code module may be compiled and linked into an executable program, installed in a dynamic link library, or may be written in an interpreted programming language. In some implementations, particular operations and methods may be performed by circuitry that is specific to a given function.

Further, certain implementations of the functionality of the present disclosure are sufficiently, mathematically, computationally, or technically complex that application-specific hardware or one or more physical computing devices (utilizing appropriate specialized executable instructions) may be necessary to perform the functionality, for example, due to the volume or complexity of the calculations involved or to provide results substantially in real-time. For example, a video may include many frames, with each frame having millions of pixels, and specifically programmed computer hardware is necessary to process the video data to provide a desired image processing task or application in a commercially reasonable amount of time. Further, pose estimation using EM tracking typically needs to be done in real time in an AR or VR environment, and hardware processing is required to perform the pose estimation task and the correction of ambient field distortions, to provide an enjoyable user experience.

Code modules or any type of data may be stored on any type of non-transitory computer-readable medium, such as physical computer storage including hard drives, solid state memory, random access memory (RAM), read only memory (ROM), optical disc, volatile or non-volatile storage, combinations of the same and/or the like. The methods and modules (or data) may also be transmitted as generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). The results of the disclosed processes or process steps may be stored, persistently or otherwise, in any type of non-transitory, tangible computer storage or may be communicated via a computer-readable transmission medium.

Any processes, blocks, states, steps, or functionalities in flow diagrams described herein and/or depicted in the attached figures should be understood as potentially representing code modules, segments, or portions of code which include one or more executable instructions for implementing specific functions (e.g., logical or arithmetical) or steps in the process. The various processes, blocks, states, steps, or functionalities can be combined, rearranged, added to, deleted from, modified, or otherwise changed from the illustrative examples provided herein. In some embodiments, additional or different computing systems or code modules may perform some or all of the functionalities described herein. The methods and processes described herein are also not limited to any particular sequence, and the blocks, steps, or states relating thereto can be performed in other sequences that are appropriate, for example, in serial, in parallel, or in some other manner. Tasks or events may be added to or removed from the disclosed example embodiments. Moreover, the separation of various system components in the implementations described herein is for illustrative purposes and should not be understood as requiring such separation in all implementations. It should be understood that the described program components, methods, and systems can generally be integrated together in a single computer product or packaged into multiple computer products. Many implementation variations are possible.

The processes, methods, and systems may be implemented in a network (or distributed) computing environment. Network environments include enterprise-wide computer networks, intranets, local area networks (LAN), wide area networks (WAN), personal area networks (PAN), cloud computing networks, crowd-sourced computing networks, the Internet, and the World Wide Web. The network may be a wired or a wireless network or any other type of communication network.

The disclosure includes methods that may be performed using the subject devices. The methods may include the act of providing such a suitable device. Such provision may be performed by the end user. In other words, the "providing" act merely requires the end user obtain, access, approach, position, set-up, activate, power-up or otherwise act to provide the requisite device in the subject method. Methods recited herein may be carried out in any order of the recited events which is logically possible, as well as in the recited order of events.

The systems and methods of the disclosure each have several innovative aspects, no single one of which is solely responsible or required for the desirable attributes disclosed herein. The various features and processes described above may be used independently of one another, or may be combined in various ways. All possible combinations and subcombinations are intended to fall within the scope of this disclosure. Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. No single feature or group of features is necessary or indispensable to each and every embodiment.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Except as specifically defined herein, all technical and scientific terms used herein are to be given as broad a commonly understood meaning as possible while maintaining claim validity.

As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain embodiments require at least one of X, at least one of Y and at least one of Z to each be present.

Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted can be incorporated in the example methods and processes that are schematically illustrated. For example, one or more additional operations can be performed before, after, simultaneously, or between any of the illustrated operations. Additionally, the operations may be rearranged or reordered in other implementations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A system comprising:
 a head mounted wearable component including an outward-facing imaging system;
 an electromagnetic (EM) emitter configured to generate a magnetic field;
 an EM sensor configured to sense the magnetic field and provide EM sensor data;
 a hand-held user input device, wherein the EM emitter or the EM sensor is included in the hand-held user input device; and
 a hardware processor programmed to:
 based on the hand-held user input device with the EM emitter or EM sensor not being in a field of view of the outward-facing imaging system of the head mounted wearable component, determine that EM distortion correction is not needed;
 based on the hand-held user input device with the EM emitter or EM sensor being in the field of view of the outward-facing imaging system of the head mounted wearable component, determine that EM distortion correction is needed and:
 receive EM sensor data from the EM sensor, the EM sensor data comprising an EM field matrix;
 detect presence of EM distortion caused by the EM emitter or EM sensor of the hand-held user input device being present in the field of view of the outward-facing imaging system of the head mounted wearable component;
 when either the detected EM distortion is above a first threshold or a change in the detected EM distortion resulting from real-time motion of the system is above a second threshold:
 calculate, based at least partly on the EM sensor data, distortion compensating matrices such that a determinant of each of the distortion compensating matrices is close to unity;
 calculate, based at least partly on the distortion compensating matrices, an undistorted EM field matrix such that eigenvalues of the undistorted EM field matrix are proportional to [1, ½, ½]; and
 calculate, based at least partly on the undistorted EM field matrix, a pose of the EM sensor; and
 when neither the detected EM distortion is above the first threshold nor a change in the detected EM distortion resulting from real-time motion of the system is above the second threshold:
 not calculate, based at least partly on the EM sensor data, distortion compensating matrices.

2. The system of claim 1,
 wherein the hardware processor is programmed to:
 analyze images obtained by the outward-facing imaging system;
 determine, based at least partly on the analyzed images, a pose of the user input device; and
 calculate the distortion compensating matrices based at least in part on the determined pose of the user input device.

3. The system of claim 1, wherein the distortion compensating matrices comprise a first matrix CL and a second matrix CR, and to calculate the undistorted EM field matrix, the hardware processor is programmed to evaluate CL Fd CR where Fd is the EM field matrix.

4. The system of claim 1, wherein to calculate the pose of the EM sensor, the hardware processor is programmed to use direct computational methods that do not utilize numerical iteration.

5. The system of any claim 1, wherein the hardware processor is further programmed to render a virtual object based at least in part on the calculated pose.

6. The system of claim 1, wherein the hardware processor is further programmed to calculate a degree of EM distortion in an ambient environment using a metric based on eigenvalues of the EM field matrix.

7. The system of claim 6, wherein the metric is based on a combination of differences of the eigenvalues from a reference value.

8. The system of claim 7, wherein the eigenvalues are normalized based on a determinant of the EM field matrix.

9. The system of claim 1, wherein to calculate the distortion compensating matrices, the hardware processor is further programmed to compare the EM sensor data to ground truth data for a relative pose of the EM sensor to an EM emitter obtained by a non-EM tracking system.

10. The system of claim 9, wherein the non-EM tracking system comprises an imaging system or an ultrasound system.

11. A method for correcting for electromagnetic (EM) distortion in an EM tracking system, the method comprising:
based on a hand-held user input device including an EM emitter or EM sensor therein not being in a field of view of an outward-facing imaging system of a head mounted wearable component, determining that EM distortion correction is not needed;
based on the hand-held user input device including the EM emitter or EM sensor therein being in the field of view of the outward-facing imaging system of the head mounted wearable component, determining that EM distortion correction is needed and, under control of a hardware processor:
receiving EM sensor data from an EM sensor, the EM sensor data comprising an EM field matrix;
detecting the presence of EM distortion caused by the EM emitter or EM sensor of the hand-held user input device being present in the field of view of the outward-facing imaging system of the head mounted wearable component;
when either the detected EM distortion is above a first threshold or a change in the detected EM distortion resulting from real-time motion of the EM tracking system is above a second threshold:
calculating, based at least partly on the EM sensor data, distortion compensating matrices such that a determinant of each of the distortion compensating matrices is close to unity;
calculating, based at least partly on the distortion compensating matrices, an undistorted EM field matrix such that eigenvalues of the undistorted EM field matrix are proportional to $[1, \frac{1}{2}, \frac{1}{2}]$; and
calculating, based at least partly on the undistorted EM field matrix, a pose of the EM sensor; and
when neither the detected EM distortion is above the first threshold nor a change in the detected EM distortion resulting from real-time motion of the EM tracking system is above the second threshold:
not calculating, based at least partly on the EM sensor data, distortion compensating matrices.

12. The method of claim 11, wherein the pose comprises a six degree-of-freedom (6DOF) pose.

13. The method of claim 11, further comprising detecting presence of an EM distortion.

14. The method of claim 13, wherein detecting the presence of the EM distortion further comprises calculating a deviation of eigenvalues of the EM field matrix from the eigenvalues of the undistorted EM field matrix.

15. The method of claim 14, wherein detecting the presence of the EM distortion comprises determining that a deviation of the eigenvalues exceeds a threshold.

16. The method of claim 11, wherein calculating the distortion compensating matrices further comprises comparing to ground truth data for a relative pose of the EM sensor to an EM emitter obtained by a non-EM tracking system.

17. The method of claim 16, wherein the non-EM tracking system comprises an imaging system or an ultrasound system.

18. The method of claim 11, further comprising calculating a degree of EM distortion in an ambient environment using a metric based on eigenvalues of the EM field matrix.

19. The method of claim 18, wherein the metric is based on a combination of differences of the eigenvalues from a reference value.

20. The method of claim 19, wherein the eigenvalues are normalized based on a determinant of the EM field matrix.

* * * * *

UNITED STATES PATENT AND TRADEMARK OFFICE
CERTIFICATE OF CORRECTION

PATENT NO. : 12,293,029 B2
APPLICATION NO. : 17/505497
DATED : May 6, 2025
INVENTOR(S) : Richmond B. Chan It is certified that error appears in the above-identified patent and that said Letters Patent is hereby corrected as shown below:

In the Claims

Column 38, Claim 3, Line 46:
The wording "matrix CL and" should read: -- matrix $C_L$ and --.

Column 38, Claim 3, Line 47:
The wording "matrix CR, and" should read: -- matrix $C_R$, and --.

Column 38, Claim 3, Lines 48-49:
The wording "to evaluate CL Fd Cr where Fd is the" should read: -- to evaluate $C_L$ $F_d$ Cr where $F_d$ is the --.

Column 38, Claim 5, Line 54:
The wording "The system of any claim 1," should read: -- The system of claim 1, --.

Signed and Sealed this
Twenty-sixth Day of August, 2025

Coke Morgan Stewart
*Acting Director of the United States Patent and Trademark Office*